(12) United States Patent
Shimizu et al.

(10) Patent No.: US 8,436,417 B2
(45) Date of Patent: May 7, 2013

(54) OXIDE CLUSTER SEMICONDUCTOR MEMORY DEVICE

(75) Inventors: Tatsuo Shimizu, Tokyo (JP); Atsuhiro Kinoshita, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 106 days.

(21) Appl. No.: 12/880,711

(22) Filed: Sep. 13, 2010

(65) Prior Publication Data
US 2011/0233655 A1    Sep. 29, 2011

(30) Foreign Application Priority Data

Mar. 26, 2010    (JP) .................................. 2010-073699

(51) Int. Cl.
*H01L 29/792*    (2006.01)
(52) U.S. Cl.
USPC .................... 257/325; 257/314; 257/E29.309
(58) Field of Classification Search .................. 257/314, 257/325, E29.309
See application file for complete search history.

(56) References Cited

U.S. PATENT DOCUMENTS

| 7,763,934 | B2 | 7/2010 | Shimizu et al. | |
| 2007/0228454 | A1* | 10/2007 | Sugizaki | 257/316 |
| 2008/0217680 | A1 | 9/2008 | Shimizu et al. | |
| 2008/0237697 | A1* | 10/2008 | Shimizu et al. | 257/325 |
| 2009/0035904 | A1* | 2/2009 | Bhattacharyya | 438/261 |

FOREIGN PATENT DOCUMENTS

| JP | 2006-66804 | * | 3/2006 |
| JP | 2008-91421 | | 4/2008 |
| JP | 2008-218482 | * | 9/2008 |
| WO | WO 2006/059368 A1 | | 6/2006 |
| WO | WO 2006/095890 A1 | | 9/2006 |

OTHER PUBLICATIONS

Office Action issued Feb. 17, 2012 in Japan Application No. 2010-073699 (English Translation).
Office Action issued Nov. 9, 2012 in Japanese Patent Application No. 2010-073699 (with English-language translation).

* cited by examiner

*Primary Examiner* — Jerome Jackson, Jr.
*Assistant Examiner* — Paul Budd
(74) *Attorney, Agent, or Firm* — Oblon, Spivak, McClelland, Maier & Neustadt, L.L.P.

(57) ABSTRACT

According to one embodiment, in a semiconductor memory device, a source region and a drain region are disposed away from each other in the semiconductor layer. A tunnel insulating film is formed between the source region and the drain region on the semiconductor layer. A charge accumulating film includes an oxide cluster and is formed on the tunnel insulating film. A block insulating film is formed on the charge accumulating film. A gate electrode is formed on the block insulating film. The oxide cluster includes either Zr or Hf, and further contains at least one element selected from Ti, V, Cr, Mn, Fe, Co, Ni, Cu, Zn, Nb, Mo, Tc, Ru, Rh, Pd, Ag, Cd, Ta, W, Re, Os, Ir, Pt, Au and Hg.

14 Claims, 19 Drawing Sheets

Direction of NAND column

OXIDE CLUSTER SEMICONDUCTOR MEMORY DEVICE

CROSS REFERENCE TO RELATED APPLICATION

This application is based upon and claims the benefit of priority from the prior Japanese Patent Application No. 2010-073699, filed on Mar. 26, 2010, the entire contents of which are incorporated herein by reference.

FIELD

Embodiments described herein relate generally to a semiconductor memory device and a manufacturing the semiconductor memory device.

BACKGROUND

A semiconductor memory device in which a silicon oxide film and a gate insulating film are provided in this order on a p-type silicon substrate is known. Impurities such as Al atoms, Au atoms and Ti atoms are included in the silicon oxide film of the semiconductor memory device. Charges are accumulated in trap sites introduced by the impurities. The semiconductor memory device is disclosed in International Patent Application Publication WO2006-095890.

But in the semiconductor memory device, as Al atoms, Au atoms and Ti atoms diffuse in the silicon oxide, the charges accumulated in the silicon oxide film diffuse. Accordingly, it is difficult to accumulate the charges effectively.

DETAILED DESCRIPTION

Figure 1:
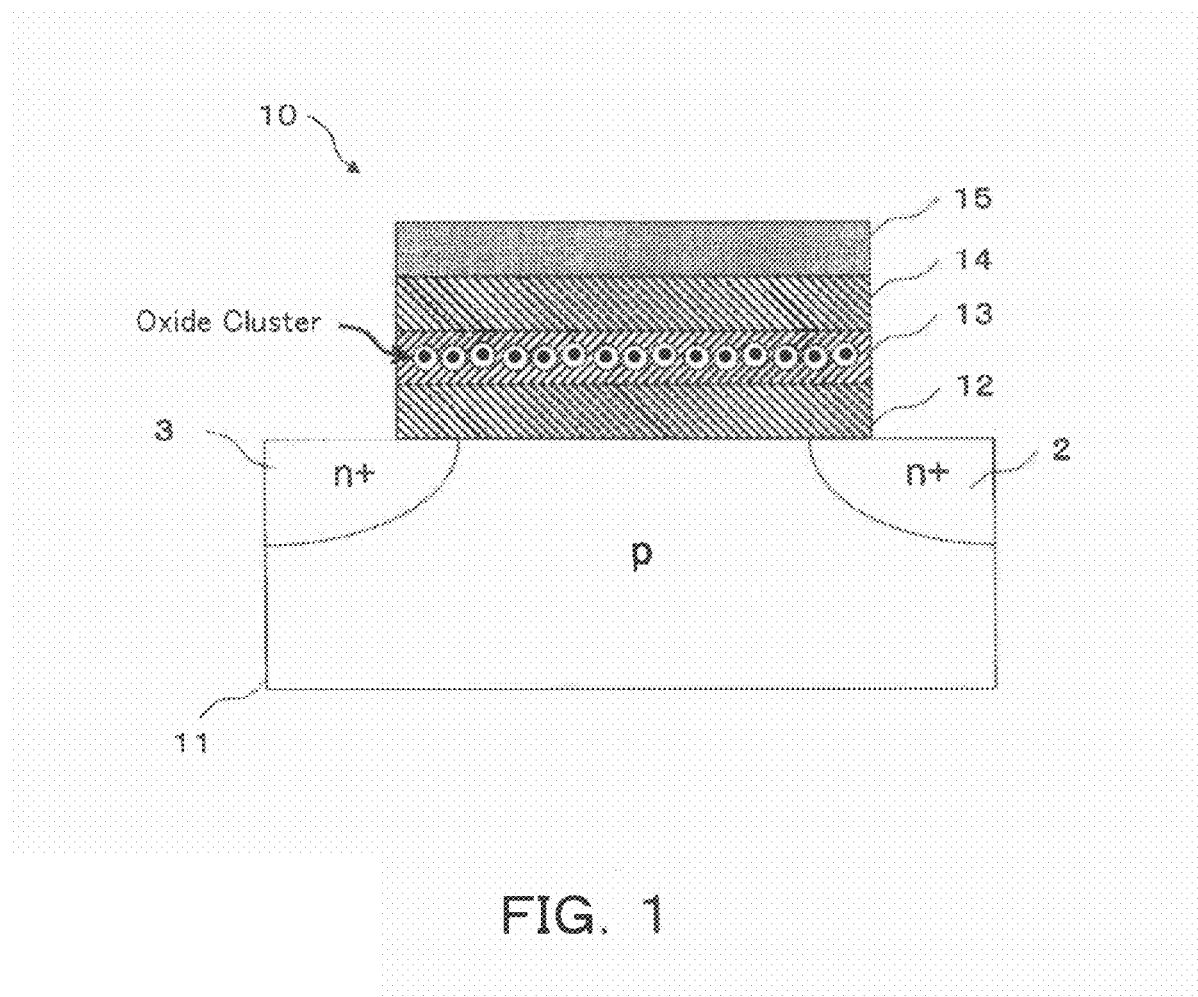
FIG. 1 is a view showing a semiconductor memory device 10 according to a first embodiment.

According to one embodiment, in a semiconductor memory device, a source region and a drain region are disposed away from each other in the semiconductor layer. A tunnel insulating film is formed between the source region and the drain region on the semiconductor layer. The tunnel insulating film is at least one compound selected from a silicon oxide, a silicon oxynitride, a silicon nitride, an aluminum oxide, an aluminum oxynitride, and an aluminum nitride. A charge accumulating film is formed on the tunnel insulating film and includes a zirconium oxide cluster or a hafnium oxide cluster. A block insulating film is formed on the charge accumulating film. A gate electrode is formed on the block insulating film. The zirconium oxide cluster or the hafnium oxide cluster includes at least one element selected from Ti, V, Cr, Mn, Fe, Co, Ni, Cu, Zn, Nb, Mo, Tc, Ru, Rh, Pd, Ag, Cd, Ta, W, Re, Os, Ir, Pt, Au and Hg.

According to another embodiment, in a method for manufacturing the semiconductor memory device, a tunnel insulating film is formed on a semiconductor layer. A plurality of elements is deposited on the tunnel insulating film so as to form an island shaped metallic particle. The metallic particle formed on the tunnel insulating film is oxidized so as to form an oxide cluster. At least one compound selected from a silicon oxide, a silicon oxynitride, a silicon nitride, an aluminum oxide, an aluminum oxynitride and an aluminum nitride is deposited covering the oxide cluster formed on the tunnel insulating film so as to form a charge accumulating film. A block insulating film is formed on the charge accumulating film. A gate electrode is formed on the block insulating film.

Hereinafter, one embodiment will be described with reference to the drawings. In the drawings, same reference characters denote the same or similar portions.

FIG. 1 shows a semiconductor memory device 10 according to a first embodiment.

In the semiconductor memory device 10 according to the embodiment, a tunnel insulating film 12, a charge accumulating film 13, a block insulating film 14 and a gate electrode 15 are provided on a semiconductor layer 11 in this order. A channel region in which current flows in case that voltage is applied to the gate electrode 15 is formed under the tunnel insulating film 12 in the semiconductor layer 11. In the semiconductor layer 11, a drain region 2 and a source region 3 are formed to sandwich the channel region. In addition, it is decided that the semiconductor layer 11 is of the p-type, and the drain region 2 and the source region 3 are of the n-type in FIG. 1. But, the semiconductor layer 11 may be of the n-type, and the drain region 2 and the source region 3 may be of the p-type.

The semiconductor memory device 10 according to the embodiment accumulates charges from the channel region to the charge accumulating film 13 by applying voltage to the gate electrode 15 and stores information in the charge accumulating film 13.

Single crystal Si is generally used as the semiconductor layer 11, for example, but polycrystalline Si, amorphous Si, SiGe, one-layer graphene, multi-layer graphene, Ge, or SOI (Silicon On Insulator) and so on can be quoted as other examples.

In addition, a compound semiconductor or an organic polymer and so on may be used as the semiconductor layer 11. SiC, GaAs, InP, InAs, GaInAs, GaN or GaInN or the like may be used as the compound semiconductor, for example. Pentacene or the like may be used as the organic polymer, for example.

Silicon oxide and aluminum oxide can be used as the tunnel insulating layer 12. $SiO_2$ can be used as the silicon oxide, for example. $Al_2O_3$ can be used as the aluminum oxide, for example. In addition, silicon oxynitride and silicon nitride can be used as the tunnel insulating film 12. A structure formed by laminating a plurality of layers of the silicon oxynitride and the silicon nitride may be used. SiON can be used as the silicon oxynitride, for example. SiN can be used as the silicon nitride, for example. The tunnel insulating film 12 may be composed of a laminated structure such as $SiO_2/Si_3N_4/SiO_2$, $SiO_2/Al_2O_3$. A film thickness of the tunnel insulating film 12 is not less than 0.5 nm and not more than 5 nm, for example.

Oxide clusters are formed in the charge accumulating film 13, and oxides such as $SiO_2$ or $Al_2O_3$ cover the oxide clusters. A film thickness of the charge accumulating film 13 is not less than 0.4 nm and not more than 2.8 nm, for example. The oxide cluster means a cluster including oxygen and metallic element.

The oxide cluster makes metallic oxide selected from titanium oxide (Ti oxide), zirconium oxide (Zr oxide) and hafnium oxide (Hf oxide) as base material. It is sufficient that the above-described Ti, Zr and Hf are oxidized as the base material of the oxide cluster. With respect to the concrete material for the base material, $ZrO_2$, $SrZrO_3$, $(Ba, Sr, Ca)ZrO_3$ or $La_2Zr_2O_7$ can be used as the zirconium oxide, for example. $HfO_2$, $SrHfO_3$, $(Ba, Sr, Ca)HfO_3$ or $La_2Hf_2O_7$ can be used as the hafnium oxide, for example. $TiO_2$, $SrTiO_3$, $(Ba, Sr, Ca)TiO_3$ or $La_2Ti_2O_7$ can be used as the titanium oxide, for example.

The zirconium oxide and the hafnium oxide include at least one element selected from Ti, V, Cr, Mn, Fe, Co, Ni, Cu, Zn, Nb, Mo, Tc, Ru, Rh, Pd, Ag, Cd, Ta, W, Re, Os, Ir, Pt, Au and Hg. These elements replace zirconium or hafnium composing the base material of the oxide cluster.

The titanium oxide includes at least one element selected from V, Cr, Mn, Fe, Co, Ni, Cu, Zn, Nb, Mo, Tc, Ru, Rh, Pd, Ag, Cd, Ta, W, Re, Os, Ir, Pt, Au and Hg. These elements replace titanium composing the base material of the oxide cluster.

By using such the oxide clusters, the leakage of the charges accumulated in the charge accumulating film 13 can be prevented. This is because the charges are accumulated in the oxide clusters and the oxide clusters are covered with $SiO_2$ and $Al_2O_3$ and so on, it is unlikely that the leakage of the charges occurs. In addition, as the charges are accumulated in the oxide clusters, even if a defect is generated in the tunnel insulating film 12, it is unlikely that the charges disappear.

Figure 2:
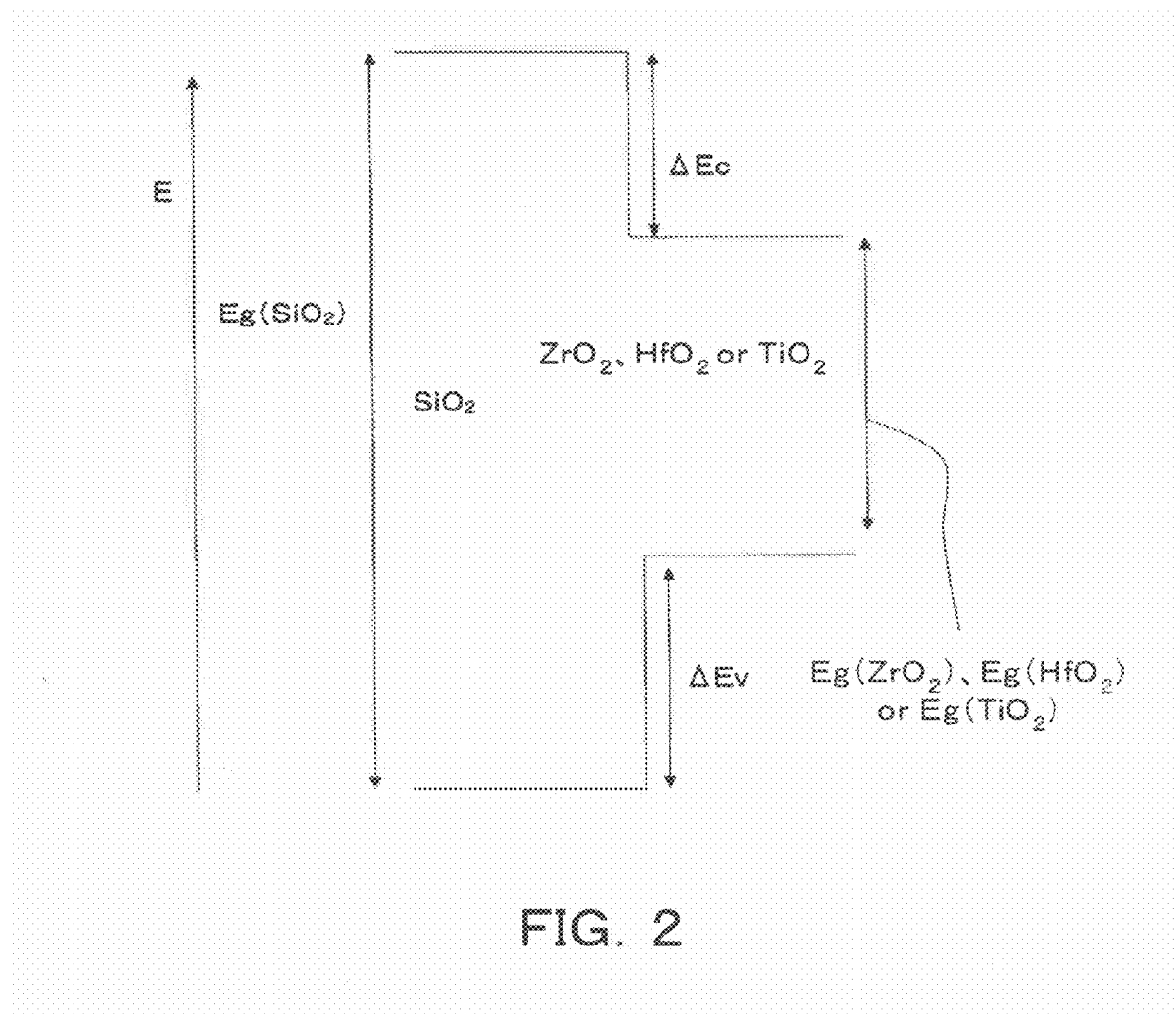
FIG. 2 is a view to describe a band gap of oxide cluster and a band gap of $SiO_2$.

FIG. 2 is a view to describe band gaps of zirconium oxide, hafnium oxide and titanium oxide and a band gap of $SiO_2$. The longitudinal axis shows an energy E. Zirconium oxide, hafnium oxide and titanium oxide are materials with high dielectric constants. Accordingly, a band offset $\Delta Ec$ or $\Delta Ev$ becomes large which is respectively the difference between a conduction band or a valence band formed by one of these oxides and a conduction band or a valence band of $SiO_2$, as shown in FIG. 2. Accordingly, the charges accumulated in the oxide clusters become unlikely to move. In particular, as $\Delta Ec$, $\Delta Ev$ of the titanium oxide are larger compared with those of the zirconium oxide and the hafnium oxide, it is possible to accumulate the charges stably in the charge accumulating film 13.

Hereinafter, the reason why the charges are accumulated in the oxide clusters will be described.

Figure 3:
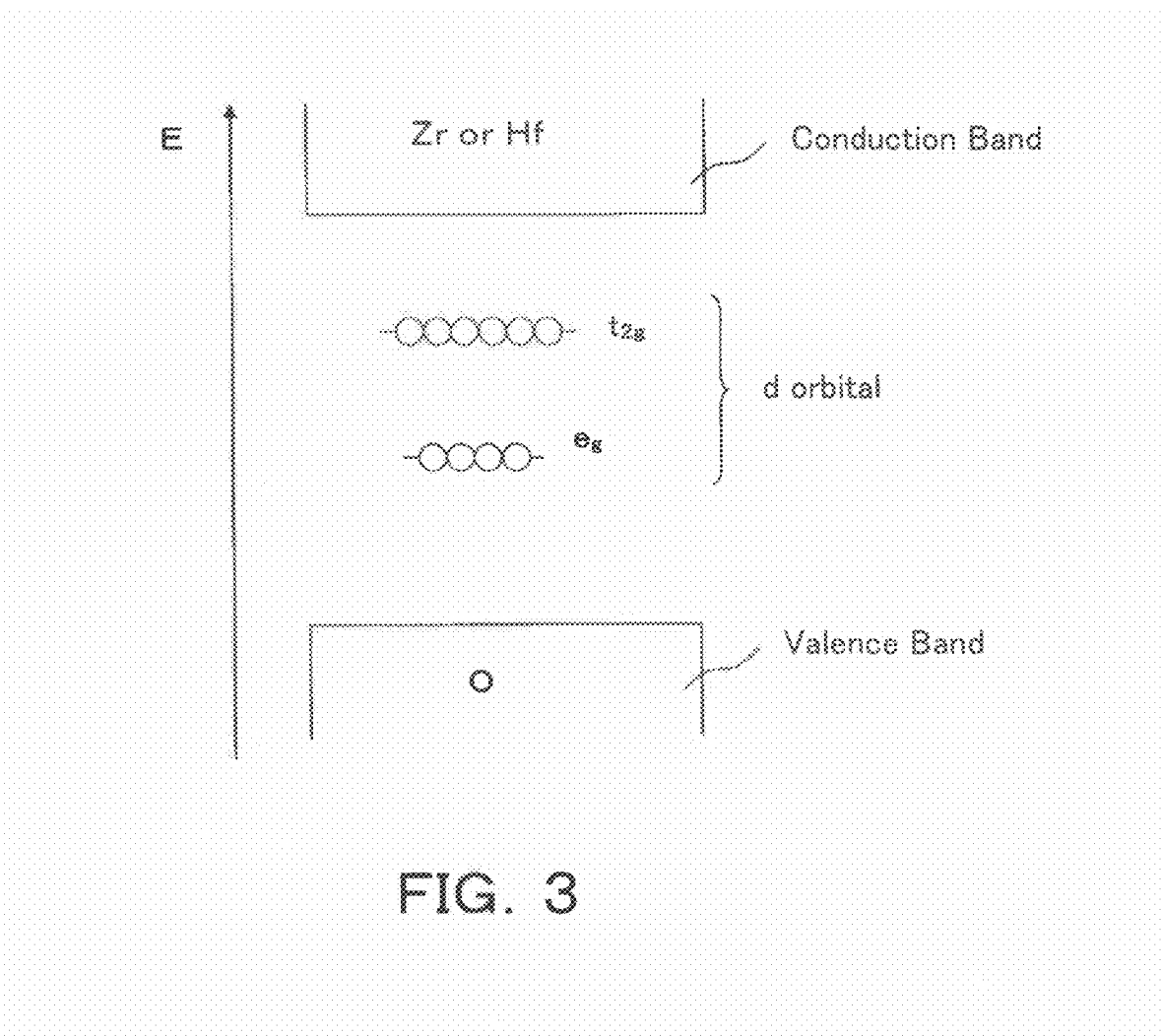
FIG. 3 is a view to describe the d orbital formed in a band gap of a zirconium oxide or a hafnium oxide.

FIG. 3 is a view to describe the d orbital formed in a case that an element selected from Ti, V, Cr, Mn, Fe, Co, Ni, Cu, Zn, Nb, Mo, Tc, Ru, Rh, Pd, Ag, Cd, Ta, W, Re, Os, Ir, Pt, Au and Hg is included in the zirconium oxide or the hafnium oxide, and zirconium in the zirconium oxide or hafnium in the hafnium oxide is replaced by one of these elements.

As shown in FIG. 3, the d orbital of Ti, V, Cr, Mn, Fe, Co, Ni, Cu, Zn, Nb, Mo, Tc, Ru, Rh, Pd, Ag, Cd, Ta, W, Re, Os, Ir, Pt, Au or Hg is formed in the band gap formed by the zirconium oxide or the hafnium oxide.

The d orbital is composed of t2g orbital composed of dxy orbital, dyz orbital and dzx orbital and eg orbital composed of dz2 orbital and dx2−y2 orbital. In addition, the eg orbital exists in an energy level lower than that of the t2g orbital in FIG. 3. But, depending on the oxidation state of the zirconium oxide or the hafnium oxide, there may be a case that the eg orbital exists in an energy level upper than that of the t2g orbital.

Ti, V, Cr, Mn, Fe, Co, Ni, Cu, Zn, Nb, Mo, Tc, Ru, Rh, Pd, Ag, Cd, Ta, W, Re, Os, Ir, Pt, Au and Hg have at least four valence electrons respectively. The four valence electrons out of these valence electrons are taken in by oxygen of the zirconium oxide or the hafnium oxide. With respect to zirconium in the zirconium oxide, four valence electrons of zirconium are taken in by oxygen of the zirconium oxide. Similarly with respect to hafnium in the hafnium oxide, four valence electrons in hafnium are taken in by oxygen of the hafnium oxide.

Accordingly, in case that Ti, V, Cr, Mn, Fe, Co, Ni, Cu, Zn, Nb, Mo, Tc, Ru, Rh, Pd, Ag, Cd, Ta, W, Re, Os, Ir, Pt, Au or Hg exists in the zirconium oxide or the hafnium oxide, the d orbital is in one of the states composed of a state that no electron exists in the d orbital through a state that eight electrons exist in the d orbital. That is, in the case of Ti, no electron exists in the d orbital. In the case of V, Nb, Ta, one electron exists in the d orbital. In the case of Cr, Mo, W, two electrons exist in the d orbital. In the case of Mn, Tc, Re, three electrons exist in the d orbital. In the case of Fe, Ru, Os, four electrons exist in the d orbital. In the case of Co, Rh, Ir, five electrons exist in the d orbital. In the case of Ni, Pd, Pt, six electrons exist in the d orbital. In the case of Cu, Ag, Au, seven electrons exist in the d orbital. In the case of Zn, Cd, Hg, eight electrons exist in the d orbital.

It is possible to accumulate the charges in the oxide clusters by filling the electron in the d orbital. In addition, the d orbital of hafnium introduced in the zirconium oxide or the d orbital of zirconium introduced in the hafnium oxide does not exist in each band gap, but is formed in a conduction band. Thus, as the electron can not be accumulated in the d orbital in this case, this combination is meaningless.

Figure 4:
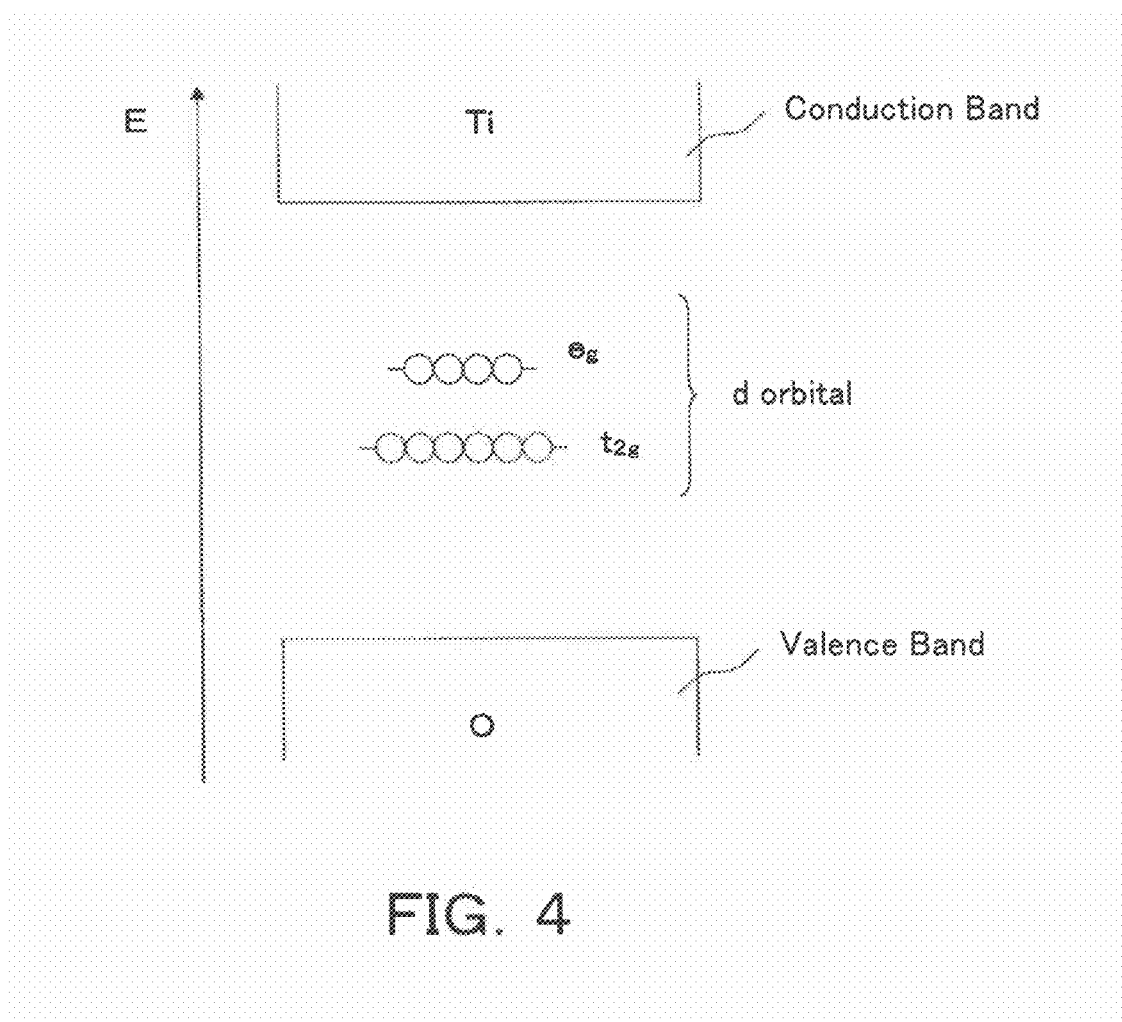
FIG. 4 is a view to describe a d orbital formed in a band gap of the titanium oxide.

FIG. 4 is a view to describe the d orbital formed in a case that an element selected from V, Cr, Mn, Fe, Co, Ni, Cu, Zn, Nb, Mo, Tc, Ru, Rh, Pd, Ag, Cd, Ta, W, Re, Os, Ir, Pt, Au and Hg is included in the titanium oxide, and titanium in the titanium oxide is replaced by one of these elements. In addition, the t2g orbital exists in a lower energy level than that of the eg orbital in FIG. 4. But depending on the oxidation state of the titanium oxide, there may be a case that the t2g orbital exists in an upper energy level than that of the eg orbital.

V, Cr, Mn, Fe, Co, Ni, Cu, Zn, Nb, Mo, Tc, Ru, Rh, Pd, Ag, Cd, Ta, W, Re, Os, Ir, Pt, Au and Hg have at least five valence electrons respectively. The four electrons out of these valence electrons are taken in by oxygen of the titanium oxide. With respect to titanium in the titanium oxide, four valence electrons of titanium are taken in by oxygen in the titanium oxide.

Accordingly, in case that V, Cr, Mn, Fe, Co, Ni, Cu, Zn, Nb, Mo, Tc, Ru, Rh, Pd, Ag, Cd, Ta, W, Re, Os, Ir, Pt, Au or Hg exists in the titanium oxide, the d orbital becomes in a state that at least one electron exists in the d orbital. That is, in the case of V, Nb, Ta, one electron exists in the d orbital. In the case of Cr, Mo, W, two electrons exist in the d orbital. In the case of Mn, Tc, Re, three electrons exist in the d orbital. In the case of Fe, Ru, Os, four electrons exist in the d orbital. In the case of Co, Rh, Ir, five electrons exist in the d orbital. In the case of Ni, Pd, Pt, six electrons exist in the d orbital. In the case of Cu, Ag, Au, seven electrons exist in the d orbital. In the case of Zn, Cd, Hg, eight electrons exist in the d orbital.

It is possible to accumulate charges in the oxide clusters by filling the electron in the d orbital. In addition, the d orbital of hafnium or zirconium introduced in the titanium oxide does not appear in each band gap, but is formed in a conduction band. Thus, as the electron can not be accumulated in the d orbital, this combination is meaningless.

As described above, the embodiment assumes a case that titanium, zirconium or hafnium composing the basic material of the oxide cluster is replaced by another element. In a state where W is added to $HfO_2$, W replaces Hf of $HfO_2$. In this time, the d orbital of W appears in the band gap formed by $HfO_2$, and the electron can be taken in or out from the state. On the other hands, in a state where $HfO_2$ and $WO_3$ are simply mixed, as the d orbital does not appear in the band gap of $HfO_2$, the electron can not be taken in or out.

Figure 5A:
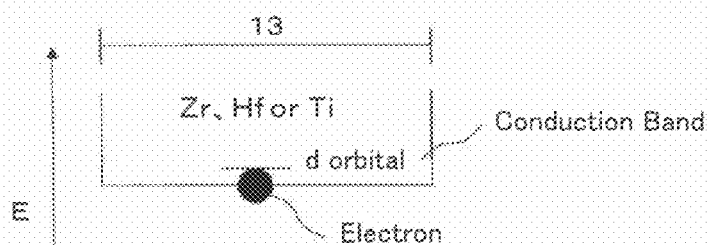
FIGS. 5A, 5B are views to describe a band gap formed by the oxide cluster replaced by Ta or Nb.
Figure 5B:
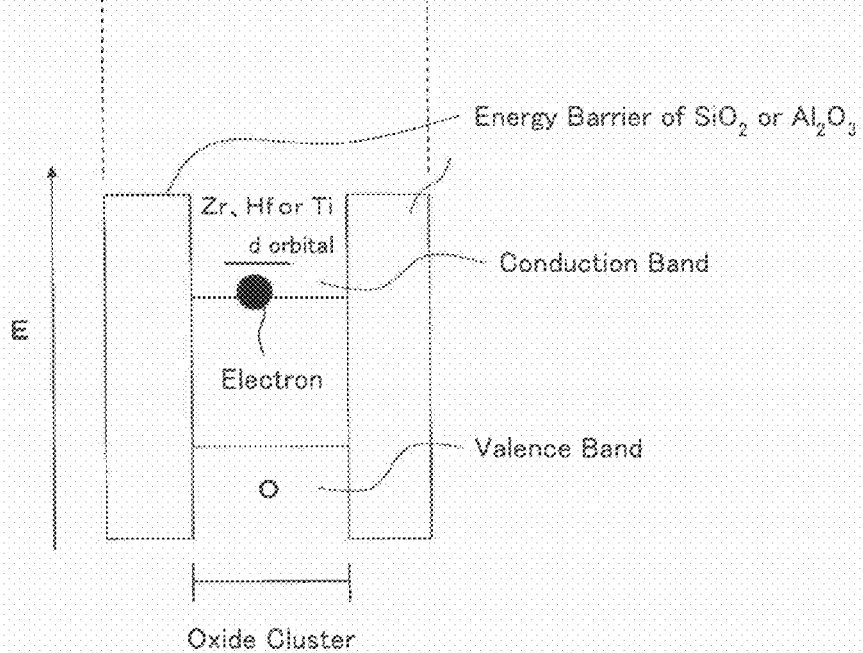

FIG. 5A is a view showing a band gap formed by the zirconium oxide, the hafnium oxide or the titanium oxide and the d orbital formed by Ta or Nb. Zirconium, hafnium or titanium in the zirconium oxide, the hafnium oxide or the titanium oxide is replaced by Ta or Nb. The d orbital of Ta or Nb is formed in the vicinity of the conduction band in the band gap formed by the zirconium oxide, the hafnium oxide or the titanium oxide, or in the conduction band. For the reason the electron in the d orbital is easy to move to the conduction band, causing the leakage of the charges. Accordingly, conventionally, it was not possible to use the zirconium oxide, the hafnium oxide or the titanium oxide added with Ta or Nb as a charge accumulating film. But in the embodiment, in a case that zirconium, hafnium or titanium in the zirconium oxide, the hafnium oxide or the titanium oxide is replaced by Ta or Nb, as the d orbital of Ta or Nb is covered three dimensionally by an oxide such as $SiO_2$ or $Al_2O_3$ or the like having a large energy barrier as shown in FIG. 5B, the leakage of the electron is unlikely to occur. That is, Ta or Nb becomes a usable material first by being surrounded by $SiO_2$ or $Al_2O_3$ or the like having a large energy barrier.

In addition, though an element with a valency of divalent or trivalent is added to the zirconium oxide, the hafnium oxide or the titanium oxide, a level of the d orbital is not generated in the band gap. This can be described in the following. If a trivalent element is added to the zirconium oxide, the trivalent element gives only three electrons to the oxygen of the zirconium oxide. As the oxygen of the zirconium oxide receives four electrons, another electron is required. On the other hand, a level of an oxygen defect caused by the addition of the trivalent element exists in the zirconium oxide. An electron exists in the oxygen defect, and the electron is taken by the oxygen of the zirconium oxide. In this time, the trivalent element becomes in +3 valency and exists in the conduction band formed by the zirconium oxide. Thus, the d orbital does not exist in the band gap formed by the zirconium oxide. For the reason, the element with a valency of divalent or trivalent can not be used to the zirconium oxide, the hafnium oxide or the titanium oxide.

In addition, in a case that $TiO_2$ is used as the charge accumulating film 13 and V, Nb or Ta is added to the charge accumulating film 13, the leakage of the charges might be generated by the interaction of the added V, Nb or Ta with each other. In this case, $TiO_2$ may become a so-called floating gate. For the reason, it becomes unlikely that the charge accumulating film 13 functions as a trap film to localize the charges. But as the charges are accumulated in the oxide clusters and $SiO_2$ or $Al_2O_3$ or the like covers around the oxide clusters in the charge accumulating film 13 according to the embodiment, such the leakage of the charges is unlikely to occur.

In addition, it is preferable that the oxide clusters are distributed on a plane in the charge accumulating film 13. The term "distributed on a plane" indicates the state that the oxide clusters are distributed substantially uniformly in-plane direction of the charge accumulating film 13. In this case, if the oxide clusters are seen from a vertical direction for the laminating direction of the charge accumulating film 13, a layer exists where one oxide cluster exists in the laminating direction of the charge accumulating film 13. By this, a half-value width of threshold voltages applied to the semiconductor memory device 10 can be made narrow. This is because, as the charges are not distributed in the laminating direction, the threshold voltages applied from the gate electrode 15 can be made uniform. A half-value width means a width of the distribution at an intermediate value of a peak value, and means a half value of the peak value.

Figure 6A:
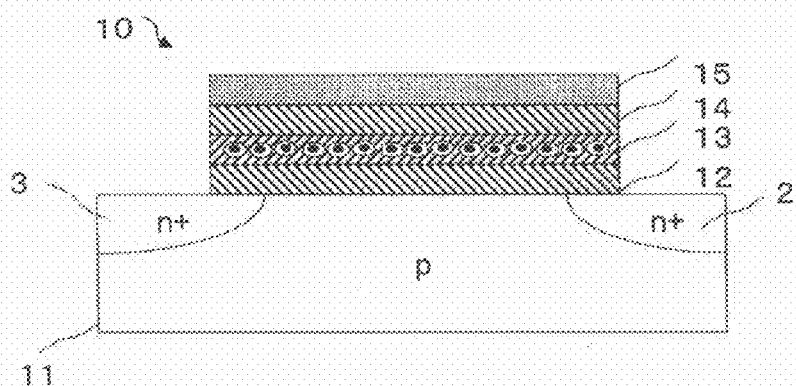
FIGS. 6A, 6B, 6C, 6D are views to describe a threshold voltage applied to a gate electrode 15.
Figure 6B:
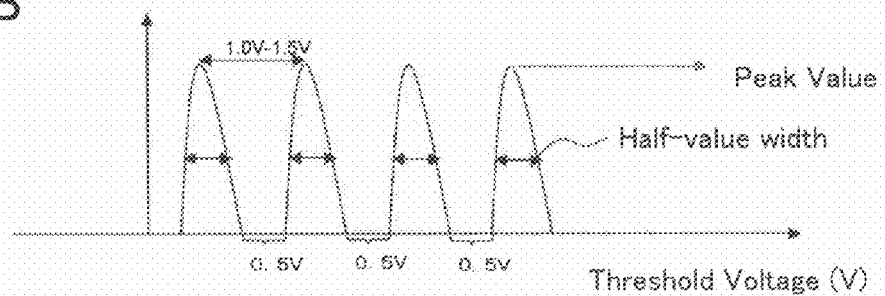

FIG. 6A shows a view of a case in which the oxide clusters are distributed on the plane in the charge accumulating film 13. FIG. 6B shows a conceptual diagram of the threshold voltages in the case that the oxide clusters are distributed on the plane in the charge accumulating film 13.

Figure 6C:
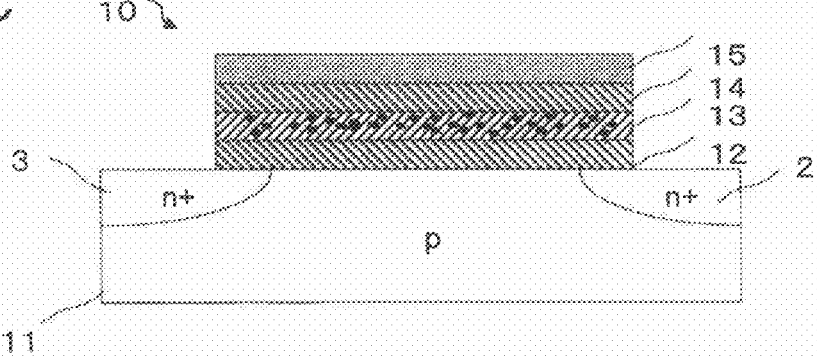
Figure 6D:
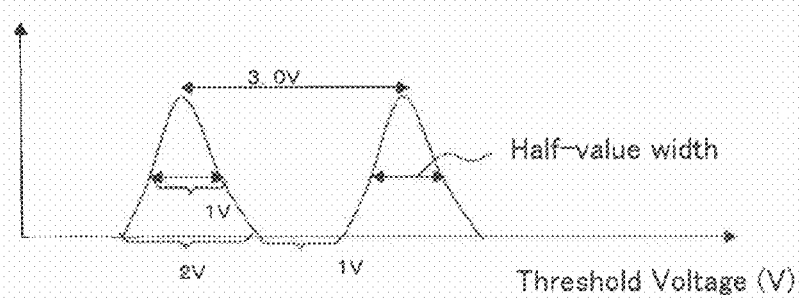

FIG. 6C shows a view of a case in which the metallic atoms are distributed in the charge accumulating film 13. FIG. 6D shows a conceptual diagram of the threshold voltages in the case that the metallic atoms are distributed in the charge accumulating film 13.

As shown in FIG. 6A, in a case that the oxide clusters are distributed on the plane in the charge accumulating film 13, a shift amount of the threshold voltages is determined by an electric field formed by the charges accumulated in the oxide clusters distributed on the plane in the charge accumulating film 13. Thus, a large charge density is required for the whole layers of the oxide clusters. As the charge accumulating film 13 of the embodiment can make many elements to be included in the oxide clusters, which will be described later, the charge accumulating film 13 can have a sufficient charge density. Thus, this point will be of no problem.

In addition, if the oxide clusters are distributed on the plane in the charge accumulating film 13, a distance to the channel region can be made constant. Thus, taking in and out the charges from the charge accumulating film 13 are easily made. Accordingly, the writing and erasing speeds in and from the semiconductor memory device 10 can be speeded up.

In addition, as there is no charge distribution in the film thickness direction of the charge accumulating film 13, a half-value width (a width of the distribution at an intermediate value of a peak value) of the threshold voltages becomes small, as shown FIG. 6B. As a result, an absolute value of the shift amount of the threshold voltages can be made small. Thus, it becomes easy to make the semiconductor memory device 10 operate in lower voltage or with multiple values. In this case, at least 1.0 V is required for the shift amount of the threshold voltages (peak to peak of the threshold voltages). In this time, it is realistic that the distribution of the threshold voltages has an interval of about 0.5 V. In addition, when the applied voltage is taken into consideration, a value of about 1.0 V is stable for the conventionally used threshold voltages. This depends on that when the threshold voltage is considered in the case of using the Si layer, the difference of Fermi energies in the band gaps of n-type Si and p-type Si is about 1.0 V. From the above-description, a value of 1.0 V at minimum is required for an LSI (Large Scale Integration) using the Si layer.

On the other hand, in a case that the metallic atoms are distributed in the charge accumulating film 13 as shown in FIG. 6C, the distances from the metallic atoms to the gate electrode 15 are not uniform. For the reason, it is difficult to make uniform the threshold voltages required for accumulating the charges in the charge accumulating film 13. Thus, the half-value width of the threshold voltages becomes large as shown in FIG. 6D. As a result, the shift amount of the threshold voltages is to be made large. In this case, 3 V at a minimum is necessary for the shift amount of the threshold voltages, for example. For obvious reasons from FIG. 6D, the large threshold voltages need to be applied in order to operate with multiple values, and the shift amount may become an unrealistic shift amount of the threshold voltage from a standpoint of the power consumption and so on.

In addition, it is preferable that a surface density of the addition elements in the oxide clusters included in the charge accumulating film 13 is not less than $8.6 \times 10^{12}$ cm$^{-2}$ and smaller than $1.25 \times 10^{15}$ cm$^{-2}$. The surface density of the addition elements indicates an amount of the addition elements included in the one oxide cluster in a face perpendicular to the laminating direction of the charge accumulating film 13.

Firstly, a value of a lower limit of the surface density of the oxide cluster will be described. Hereinafter, the surface density of the addition elements included in the one oxide cluster is simply called as the surface density of the oxide cluster.

In the semiconductor memory device 10 according to the embodiment, the threshold voltage applied to the gate electrode 15 is set to not less than 1.0 V, for example. The threshold voltage can be obtained by a following expression 1 using the relation of the surface density of the addition elements. A case is considered that the change in the threshold voltages is not less than 1.0 V when one electron comes and goes per addition element. The surface density of the addition elements is coincident with the surface density of the charges. The charge density is (surface density)×(charge amount per electron) shown in the expression 1. The charge amount per electron is $1.602 \times 10^{-19}$ C.

threshold voltage($V$)=surface density (cm$^{-2}$)×charge amount per electron($C$)×film thickness of block insulating film 14 (nm)/[relative permittivity× $8.854 \times 10^{-12}$ ($F \cdot m^{-1}$)×2]  expression 1

Here, the block insulating film 14 is assumed to be SiO$_2$. Assuming that the film thickness of the block insulating film 14 is made not more than 5.0 nm and the threshold voltage is not less than 1.0 V, the surface density becomes not less than $8.6 \times 10^{12}$ cm$^{-2}$. That is, as it is preferable that the film thickness of the block insulating film 14 is not more than 5 nm in reality, the lower limit of the surface density of the oxide cluster becomes $8.6 \times 10^{12}$ cm$^{-2}$.

Here, an equivalent oxide thickness (EOT) of SiO$_2$ will be stated in brief. It is assumed that the relative permittivity of a dielectric substance film A is ∈A, and the film thickness is TA. The relative permittivity of SiO$_2$ is 3.9. The EOT of the dielectric substance film A is defined as EOT=TA×3.9/∈A.

When the expression 1 is seen, the term (film thickness of block insulating film 14)/(relative permittivity) exists. In the above-described calculation example, the surface density was calculated using the term. But, the surface density can be considered using the film thickness of the dielectric substance A and the relative permittivity. This means that the surface density may be disputed using the relative permittivity 3.9 of SiO$_2$ and the EOT (equivalent oxide thickness of SiO$_2$). That is, it is preferable that the EOT of the block insulating film 14 becomes not more than 5 nm. In this case, the lower limit of the surface density of the oxide cluster becomes $8.6 \times 10^{12}$ cm$^{-2}$. By this, even with respect to a case where the material of the block insulating film 14 is not SiO$_2$, the lower limit of the surface density of the oxide cluster is obtained including even the difference of the relative permittivity. Though the film thickness can be considered using the EOT, the description is made in the embodiment using the physical film thickness (called as also actual film thickness).

Next, a value of an upper limit of the surface density of the oxide cluster will be described.

Figure 7:
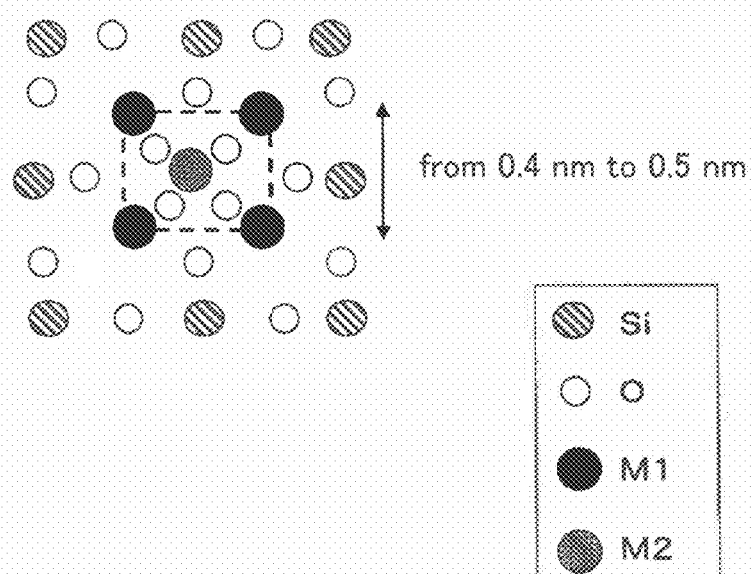
FIG. 7 is a view to describe the size of the oxide cluster.

FIG. 7 is a view showing a minimum size of the oxide cluster in a face perpendicular to the laminating direction of the charge accumulating film 13 in a case that elements M1, M2 are included in the charge accumulating film 13 composed of SiO$_2$. A portion enclosed by dotted lines is a portion corresponding to the oxide cluster.

Figure 8:
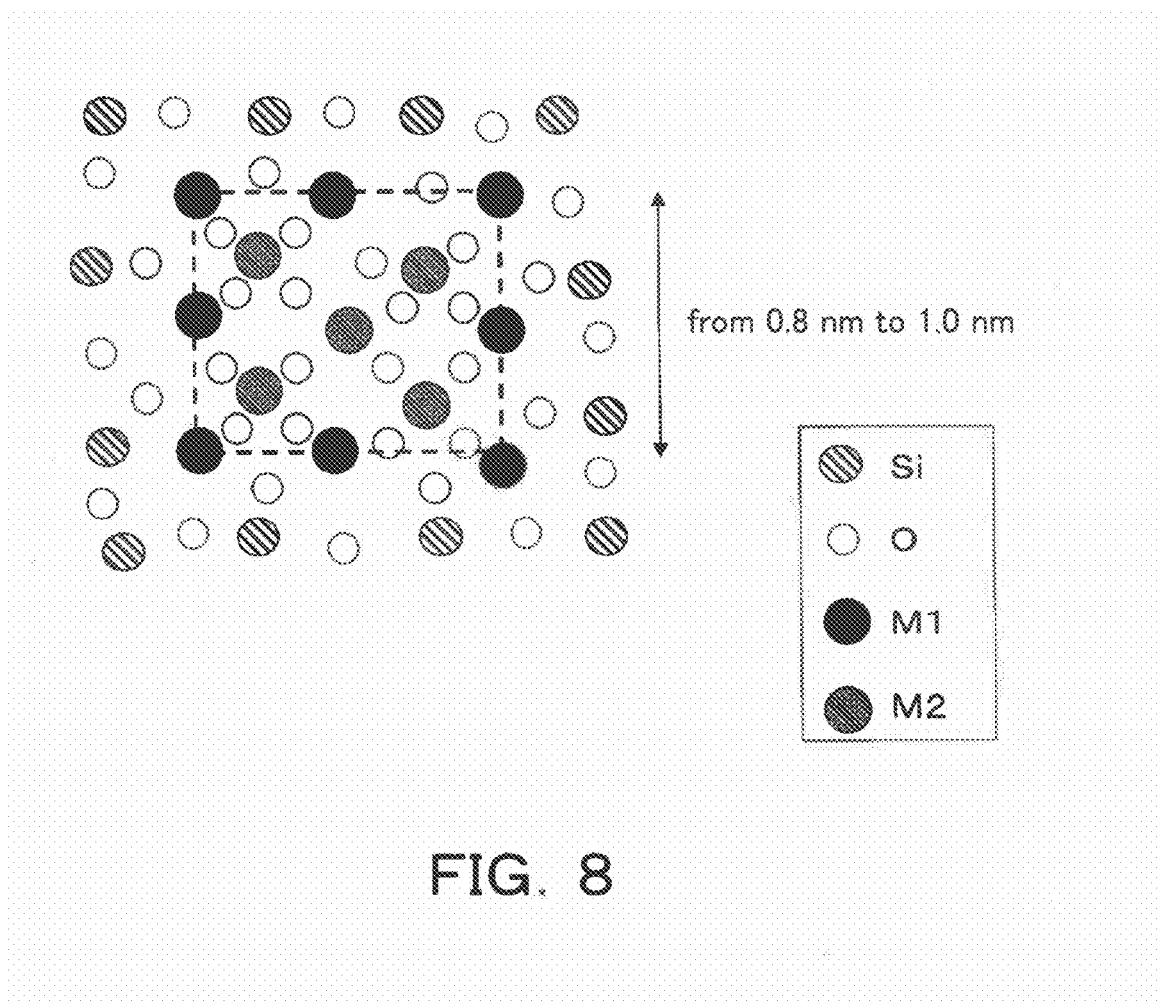
FIG. 8 is a view to describe the size of the oxide cluster.
Figure 9:
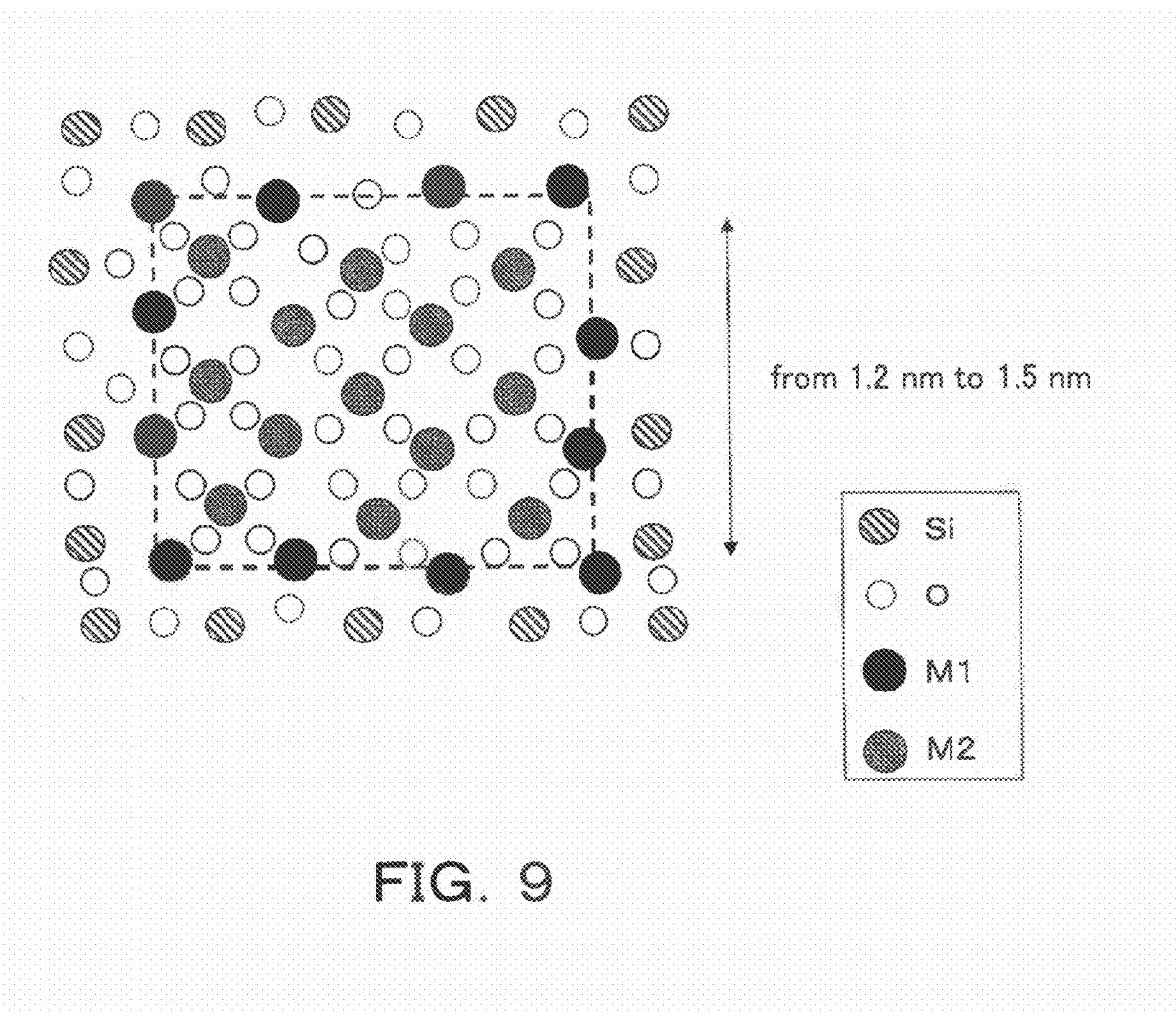
FIG. 9 is a view to describe the size of the oxide cluster.

The M1 is Ti, Zr or Hf. The M2 is Ti, V, Cr, Mn, Fe, Co, Ni, Cu, Zn, Nb, Mo, Tc, Ru, Rh, Pd, Ag, Cd, Ta, W, Re, Os, Ir, Pt, Au or Hg. In addition, FIG. 8 shows a structure with a double pitch of the oxide cluster shown in FIG. 7. A portion enclosed by dotted lines is a portion corresponding to the oxide cluster. FIG. 9 shows a structure with a triple pitch of the oxide cluster shown in FIG. 7. A portion enclosed by dotted lines is a portion corresponding to the oxide cluster.

The base material of the oxide cluster according to the embodiment is mainly of a rutile type structure, a perovskite type structure or a calcium fluoride type structure. Thinking the structure, a size of a side of the oxide cluster becomes not less than 0.4 nm and not more than 0.5 nm as shown in FIG. 7. That the size of the side has a range is based upon not only that the lattice constants of the crystals are different in the size but also that the crystal is in an amorphous state. In the double pitch structure, a size of a side of the oxide cluster is not less than 0.8 nm and not more than 1.0 nm as shown in FIG. 8. In the triple pitch structure, a size of a side of the oxide cluster is not less than 1.2 nm and not more than 1.5 nm as shown in FIG. 9. In a fivefold pitch structure, a size of a side of the oxide cluster is not less than 2.0 nm and not more than 2.5 nm.

With respect to the size of the cell for NAND flash memory use, it is preferable that the thickness of the whole films (the tunnel insulating film 12, the charge accumulating film 13 and the block insulating film 14) formed on the semiconductor layer is not more than 10 nm in actual film thickness in order to suppress the interaction between the adjacent cells. If the actual film thickness is not more than 10 nm, when converted to the EOT, the EOT becomes not more than 10 nm. Accordingly, the film thickness may be considered based on the actual film thickness.

Firstly, the thickness of the block insulating film 14 will be described. It is preferable that the thickness of the block insulating film 13 is not more than 5.0 nm so as to block the electron from passing while suppressing the film thickness of the block insulating film 14. In the embodiment, the charges are distributed on the plane in the charge accumulating film 13. For the reason, the distances can be made long between the oxide clusters in the charge accumulating film 13 and the gate electrode 15 by enlarging the film thickness of the block insulating film 14. Thus, the shift amount of the threshold voltages applied from the gate electrode 15 can be made large. In case that the distribution of the charges in the charge accumulating film 13 is discrete in the film thickness direction as shown in FIG. 6C, for example, the distribution of the threshold voltages has a large half-value width. For the reason, the thinner the thickness of the block insulating film 14 is, the better it is. But if the charges can be distributed on the plane in the charge accumulating film 13 as in the embodiment, the half-value width can be made small. Thus the shift amount of the threshold voltages can be made large. When considered as described above, it is preferable that the film thickness of the block insulating film 14 is thick to some extent. The film thickness of the block insulating film 14 is about 5.0 nm, for example. It is preferable that the film thickness of the block insulating film 14 is about 4.8 nm.

Next, the tunnel insulating film 12 will be described. When the film thickness of the tunnel insulating film 12 is thinner, writing and erasing can be speeded up more. But even if the charge accumulating film 13 is used, the charge accumulating property becomes worse. For the reason, it is preferable that the film thickness of the tunnel insulating film 12 is not less than 2.4 nm and not more than 4.8 nm.

When summarized, it is preferable that the film thickness of the block insulating film 14 is about 4.8 nm and the film thickness of the tunnel insulating film 12 is not less than 2.4 nm and not more than 4.8 nm. It is preferable that the thickness of the whole films (the tunnel insulating film 12, the charge accumulating film 13 and the block insulating film 14) formed on the semiconductor layer is not more than 10 nm. Thus, it is preferable that the film thickness of the charge accumulating film 13 is not less than 0.4 nm and not more than 2.8 nm. As it is necessary that the oxide clusters exist in the charge accumulating film 13, the film thickness of the charge accumulating film 13 may be considered to be not more than 2.8 nm. A size of a side of the oxide cluster becomes not less than 2.0 nm and not more than 2.5 nm in the fivefold pitch structure, and becomes not less than 2.4 nm and not more than 3.0 nm in the six fold pitch structure. As it is preferable that the film thickness of the charge accumulating film 13 is not more than 2.8 nm, the size of the oxide clusters in the film thickness direction is 2.5 nm at a maximum in the laminating direction of the charge accumulating film 13.

From the above-description, it is preferable that the size of the oxide clusters is not less than 0.4 nm and not more than 2.5 nm in the laminating direction of the charge accumulating film 13.

In the case that the size of the oxide cluster is at a minimum as shown in FIG. 7, the one M2 is included in the oxide cluster. Thus, the surface density of the oxide cluster becomes $1 \div (0.4 \text{ nm} \times 0.4 \text{ nm}) = 6.25 \times 10^{14} \text{ cm}^{-2}$.

In addition, in the case of FIG. 8, the five M2s are included in the oxide cluster. Thus, the surface density of the oxide cluster becomes $5 \div (0.8 \text{ nm} \times 0.8 \text{ nm}) = 7.8 \times 10^{14} \text{ cm}^{-2}$.

In the case of FIG. 9, the thirteen M2s are included in the oxide cluster. Thus the surface density of the oxide cluster becomes $13 \div (1.2 \text{ nm} \times 1.2 \text{ nm}) = 9.0 \times 10^{14} \text{ cm}^{-2}$.

Figure 10:
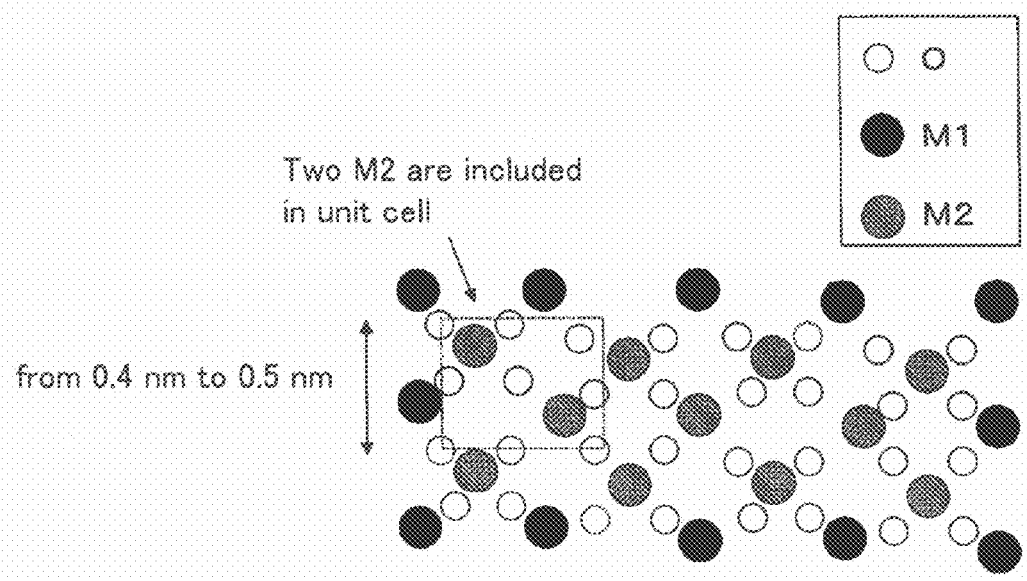
FIG. 10 is a view to describe the size of the oxide cluster.

In addition, if a case is considered that the size of the oxide cluster becomes a maximum, the charge accumulating film 13 is composed of the M1, the M2 and oxygen as shown in FIG. 10. That is, in this state, the oxide cluster has extended in the inside direction of the face of the charge accumulating film 13. In addition, Si does not exist. In this case, the two M2s exist in a unit cell of 1×1. Thus, the surface density of the oxide cluster becomes $2 \div (0.4 \text{ nm} \times 0.4 \text{ nm}) = 1.25 \times 10^{15} \text{ cm}^{-2}$. It is not good that the oxide cluster becomes so large to this extent.

As found from the above-description, the larger the oxide cluster becomes, the larger the value of the surface density becomes. Accordingly, the value of the surface density in a case that the size of the oxide cluster becomes a maximum becomes an upper limit value. Thus it is found that the upper limit of the value of the surface density of the oxide cluster is preferably smaller than $1.25 \times 10^{15} \text{ cm}^{-2}$. In addition, it is found that multiple elements (M2) can be included in the oxide cluster.

In addition, an energy in a case that the M2s are introduced into $SiO_2$ and an energy in a case that the M2s are introduced into the zirconium oxide, the hafnium oxide or the titanium oxide are examined by performing a first principle calculation using pseudo potential. As a result, it is found that the case in which the M2s are introduced into the zirconium oxide, the hafnium oxide or the titanium oxide is greatly stabilized compared with the case in which the M2s are introduced into the $SiO_2$. This is considered because as zirconium, hafnium or titanium has a large ion radius six through eight oxygen atoms are coordinated around zirconium, hafnium or titanium, and as silicon has a small ion radius four oxygen atoms are coordinated around silicon.

The charge accumulating film 13 is composed of $SiO_2$ and the oxide clusters composed of the titanium oxide are formed in the charge accumulating film 13, for example. This means that if Ru exists in the vicinity of the oxide cluster, Ru is taken in selectively in the oxide cluster.

In addition, there is Al as an element having the similar ion radius as Si. Thus, it is also possible that the charge accumulating film 13 is formed by a film of a compound such as a film of Si, Al oxide ($SiO_2$, $Al_2O_3$), a film of Si, Al nitride ($Si_3N_4$, AlN) and a film of Si, Al oxynitride (SiON, AlON) or a film formed by laminating multiple compound films, and the above-described oxide clusters are formed in the charge accumulating film 13.

Silicon oxide or aluminum oxide can be used as the block insulating film 14. $SiO_2$ can be used as the silicon oxide, for example. $Al_2O_3$ can be used as the aluminum oxide, for example. In addition, silicon oxynitride or silicon nitride can be used as the block insulating film 14. SiON can be used as the silicon oxynitride, for example. SiN can be used as the silicon nitride, for example. A structure composed by laminating multiple silicon oxynitrides and multiple silicon nitrides may be used. The block insulating film 14 may be composed of a laminated structure of $SiO_2/Si_3N_4/SiO_2$, $SiO_2/Al_2O_3$ and so on using the silicon oxide, the aluminum oxide and the silicon nitride.

Material such as Ta, TaC, TaN, TaB, Ta(O, C, N), W, WC, WN, WB, W(O, C, N), Hf, HfC, HfN, HfB, Hf(O, C, N), Re, ReC, ReN, ReO, ReB, Re(O, C, N), Nb, NbC, NbN, NbB, Nb(O, C, N), Mo, MoC, MoN, MoB, Mo(O, C, N), Zr, ZrC, ZrN, ZrB, Zr(O, C, N), Ti, TiC, TiN, TiB or Ti(O, C, N), $SrRuO_3$ or the like can be used for the gate electrode 15, for example.

Next, an operation principle of the semiconductor memory device 10 according to the embodiment will be described.

Figure 11A:
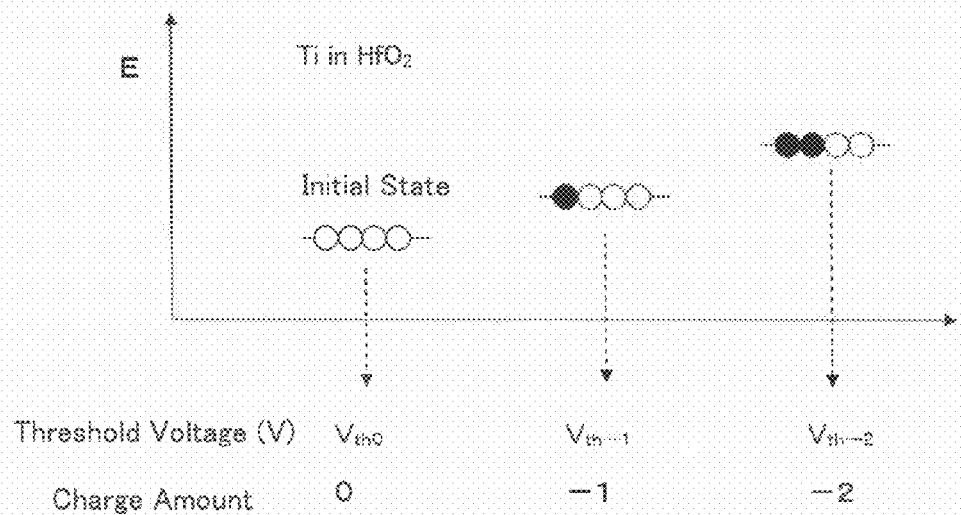
FIGS. 11A, 11B are views showing a relationship between the charges accumulated in a charge accumulating film 13 and the threshold voltage.
Figure 11B:
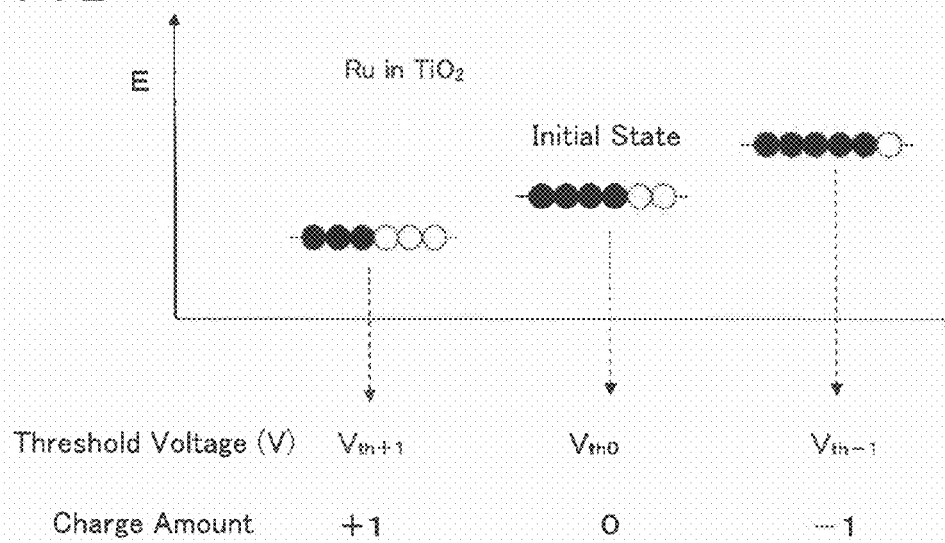

FIGS. 11A, 11B are views each describing how the charges are accumulated in the charge accumulating film 13. In order to make the description simple, cases will be described composed of a case where the d orbital is the eg orbital in FIG. 11A, and a case where the d orbital is the t2g orbital in FIG. 11B, when the d orbital is formed by the element (M2) added to the oxide cluster. In FIGS. 11A, 11B, a white circle indicates a state where an electron is not accumulated. A black circle indicates a state where an electron is accumulated. The horizontal axis indicates the threshold voltage (V) and the charge amount. Vth0 indicates a state (initial state) where the threshold voltage is 0 V. The vertical axis indicates an energy E when electron is accumulated in (or discharged from) the eg orbital or the t2g orbital. In addition, the empty eg orbital in FIG. 11A corresponds to a case where Ti is added to the zirconium oxide or the hafnium oxide and zirconium or hafnium in the zirconium oxide or hafnium oxide is replaced by Ti, for example. The t2g orbital filled with four electrons in FIG. 11B corresponds to a case where Ru is added to the titanium oxide and titanium of the titanium oxide is replaced by Ru, for example.

As shown in FIG. 11A, a threshold voltage so as to accumulate one electron in the eg orbital can be set as Vth-1, and a threshold voltage so as to accumulate two electrons can be set as Vth-2. Accordingly, a significant threshold voltage can be set. When electrons are continuously accumulated in the eg orbital, the energy level of the eg orbital rises accordingly. But, as the charge accumulating film 13 is surrounded by $SiO_2$, $Al_2O_3$ and so on with a large energy barrier, the leakage of the charges is unlikely to occur. FIG. 11B is the same, but a state exists where electron is extracted form the initial state. This state can be used well as a normally on state. This state is called as an overerase, and may happen to be used in the action of the NAND flash memory.

As shown in FIGS. 11A, 11B, when an electron is injected, the energy level rises. On the other hand, when an electron is discharged, the energy level drops. In addition, in order to inject electrons of a desired number, it is necessary to apply a control voltage corresponding to it. That is, when the control voltage is fixed to a certain control voltage, the electrons of the number corresponding to the control voltage are injected, and more electrons are not injected. That is, if the control voltage is fixed, the electrons of the corresponding number are injected, and then the injection of the electron can be automatically stopped. Using this, it is found that the memory cell with multiple values can be made easily.

In addition, the initial state of the electron changes depending on the element used in the oxide cluster. A case is shown where the t2g orbital is formed in the gap as shown in FIG. 11B, as an example. With respect to Ta, Nb or V, for example, a state where one electron exists in the t2g orbital is the initial state. With respect to W, Mo or Cr, a state where two electrons exist in the t2g orbital is the initial state, for example. With respect to Re, Tc or Mn, a state where three electrons exist in the t2g orbital is the initial state. With respect to Os, Ru or Fe, a state where four electrons exist in the t2g orbital is the initial state. With respect to Ir, Rh or Co, a state where five electrons exist in the t2g orbital is the initial state. With respect to Pt, Pd or Ni, a state where six electrons exist in the t2g orbital is the initial state.

Here, with respect to Pt, Pd or Ni, six electrons are filled in the t2g orbital. But as the eg orbital exists above the t2g orbital, four electrons can be entered into the t2g orbital.

In addition, charged states of both the plus and minus sides can be taken by discharging or taking in the electron. Thus it is possible to perform hole injection. Such a system can be used where an electron is injected at the time of writing and a hole is injected at the time of erasing, for example. The above was described with respect to a state where one element is added to the oxide cluster. But in a state where multiple elements are added to the oxide cluster, the initial state of the threshold voltages is decided by generalizing the states of the electrons existing in the d orbitals of the respective elements.

Next, a method for manufacturing the semiconductor memory device 10 according to the embodiment will be described.

Firstly, the tunnel insulating film 12 is formed on the semiconductor layer 11 using a thermal oxidation method or the like. In addition, the tunnel insulating film 12 may be formed using a CVD (Chemical Vapor Deposition) method or the like.

Next, on the tunnel insulating film 12, Zr or Hf and at least one element selected from Ti, V, Cr, Mn, Fe, Co, Ni, Cu, Zn, Nb, Mo, Tc, Ru, Rh, Pd, Ag, Cd, Ta, W, Re, Os, Ir, Pt, Au and Hg are deposited, or Ti and at least one element selected from V, Cr, Mn, Fe, Co, Ni, Cu, Zn, Nb, Mo, Tc, Ru, Rh, Pd, Ag, Cd, Ta, W, Re, Os, Ir, Pt, Au and Hg are deposited. In this time, the elements deposited on the tunnel insulating film 12 become island shaped metallic particles by Volumer-Weber type or Stranski-Krastanov type growth. In this time, it is preferable that the elements deposit by not less than 0.2 nm and not more than 1.5 nm. When the island shaped metallic particles are oxidized, oxygen is taken in between the metals, and the oxide cluster of not less than 0.4 nm and not more than 2.5 nm is formed.

Next, an oxide cluster is formed including at least one element selected from Ti, V, Cr, Mn, Fe, Co, Ni, Cu, Zn, Nb, Mo, Tc, Ru, Rh, Pd, Ag, Cd, Ta, W, Re, Os, Ir, Pt, Au and Hg in the zirconium oxide or the hafnium oxide by oxidizing the island shaped metallic particles formed on the tunnel insulating film 12. In a case that the titanium oxide is used as the base material, an oxide cluster is formed including at least one element selected from V, Cr, Mn, Fe, Co, Ni, Cu, Zn, Nb, Mo, Tc, Ru, Rh, Pd, Ag, Cd, Ta, W, Re, Os, Ir, Pt, Au and Hg. In addition, with respect to the oxidation, it is preferable to anneal after oxygen is supplied firstly. This is because it is possible to suppress the diffusion of the metallic particles which easily diffuse by annealing, by oxidizing the metallic particles firstly. As the diffusion of the metallic particles is suppressed by that the metallic particles are oxidized, the oxides of hafnium, zirconium and titanium which will be stabilized by the oxidation can be used as the base material. Thus, a structure where charges are accumulated in these oxides can be proposed. As described in FIGS. 6A, 6B, as the diffusion of the oxide clusters is suppressed, the half-value width of the threshold voltages can be made small. Supplying oxygen is performed by air exposure, for example. In addition, it is preferable that supplying oxygen is performed at a low temperature (not more than about 300 K).

Though hafnium, zirconium and titanium are stabilized by oxidation, if these metals are not oxidized, these metals diffuse greatly in $SiO_2$ and so on. As described in FIGS. 6C, 6D, when the metals diffuse, a half-value width of the threshold voltages becomes large. Considering the above, the order to anneal after oxidizing substantially is preferable so as to suppress the diffusion.

Next, the charge accumulating film 13 is formed by depositing the silicon oxide or the aluminum oxide so as to cover the oxide clusters formed on the tunnel insulating film 12. After the silicon oxide or the aluminum oxide is deposited on the tunnel insulating film 12 in first, the oxide clusters may be formed on the silicon oxide or the aluminum oxide. In this time, it is preferable that the thickness of the charge accumulating film 13 is suppressed to a minimum so as to make a sum of the film thicknesses of the tunnel insulating film 12, the charge accumulating film 13 and the block insulating film 14 not more than 10 nm.

As this, the oxide clusters can be formed at optional positions of the silicon oxide or the aluminum oxide. Accordingly, the leakage of the electrons can be prevented by the block insulating film 14, and in addition the distance between the peaks of the threshold voltages can also be set properly. Even if all of the tunnel insulating film 12, the charge accumulating film 13 and the block insulating film 14 are composed of $SiO_2$, for example, a layer of the oxide clusters can be formed at an optional position of the film thickness direction. $SiO_2$ is a material which has always been used for the tunnel insulating film 12, and the process is established. Thus, it becomes possible to add memory function easily.

Next, the block insulating film 14 and the gate electrode 15 are formed on the charge accumulating film 13, and the drain region 2 and the source region 3 are formed in the semiconductor layer 11.

In addition, the charge accumulating film 13 including the oxide clusters can also be formed by a following method. In a case that the oxide clusters with the zirconium oxide as the base material are formed, for example, ZrSiO or ZrAlO and at least one element selected from Ti, V, Cr, Mn, Fe, Co, Ni, Cu, Zn, Nb, Mo, Tc, Ru, Rh, Pd, Ag, Cd, Ta, W, Re, Os, Ir, Pt, Au and Hg are deposited on the tunnel insulating film 12 and then the heat treatment is performed. By doing as this, the oxide clusters can be formed which are covered by the silicon oxide or the aluminum oxide and include at least one element selected from Ti, V, Cr, Mn, Fe, Co, Ni, Cu, Zn, Nb, Mo, Tc, Ru, Rh, Pd, Ag, Cd, Ta, W, Re, Os, Ir, Pt, Au and Hg in the zirconium oxide. In this case, at the time of forming the charge accumulating film 13, the above-described process of depositing the silicon oxide or the aluminum oxide is not required. In addition, a compound such as nitride ($Si_3N_4$, AlN, for example) or oxynitride (SiON, AlON, for example) can be used except the silicon oxide or the aluminum oxide.

In addition, in a case that the hafnium oxide is used for the base material, HfSiO or HfAlO and at least one element selected from Ti, V, Cr, Mn, Fe, Co, Ni, Cu, Zn, Nb, Mo, Tc, Ru, Rh, Pd, Ag, Cd, Ta, W, Re, Os, Ir, Pt, Au and Hg are deposited and then the heat treatment is performed.

In addition, in a case that the titanium oxide is used for the base material, TiSiO or TiAlO and at least one element selected from V, Cr, Mn, Fe, Co, Ni, Cu, Zn, Nb, Mo, Tc, Ru, Rh, Pd, Ag, Cd, Ta, W, Re, Os, Ir, Pt, Au and Hg are deposited and then the heat treatment is performed.

In addition, the charge accumulating film 13 including the oxide clusters can be formed using a co-sputter with the zirconium oxide or the hafnium oxide and an oxide of at least one element selected from Ti, V, Cr, Mn, Fe, Co, Ni, Cu, Zn, Nb, Mo, Tc, Ru, Rh, Pd, Ag, Cd, Ta, W, Re, Os, Ir, Pt, Au and Hg. In this case, it is necessary to deposit the silicon oxide or the aluminum oxide as described above.

In addition, in a case that the oxide clusters with the titanium oxide as the base material are formed, the oxide clusters are formed using a co-sputter with the titanium oxide and an oxide of at least an element selected from V, Cr, Mn, Fe, Co, Ni, Cu, Zn, Nb, Mo, Tc, Ru, Rh, Pd, Ag, Cd, Ta, W, Re, Os, Ir, Pt, Au and Hg. In addition, the oxide clusters can be formed using $SrTiO_3$ and $SrRuO_3$ as target.

In addition, with respect to the film forming method, an ALD (Atomic Layer Deposition) method, an MBE (Molecular Beam Epitaxy) method, a sputter method and a deposition method can be used, except the above-described CVD method.

In the conventional silicon nitride film, as it was very difficult to trap holes or extract electrons excessively, the sufficient fluctuation range of the threshold voltages could not be secured. Compared with this, the large fluctuation range of the threshold voltages can be secured by extracting electrons excessively, and high speed erasing becomes possible according to the embodiment.

Figure 12:
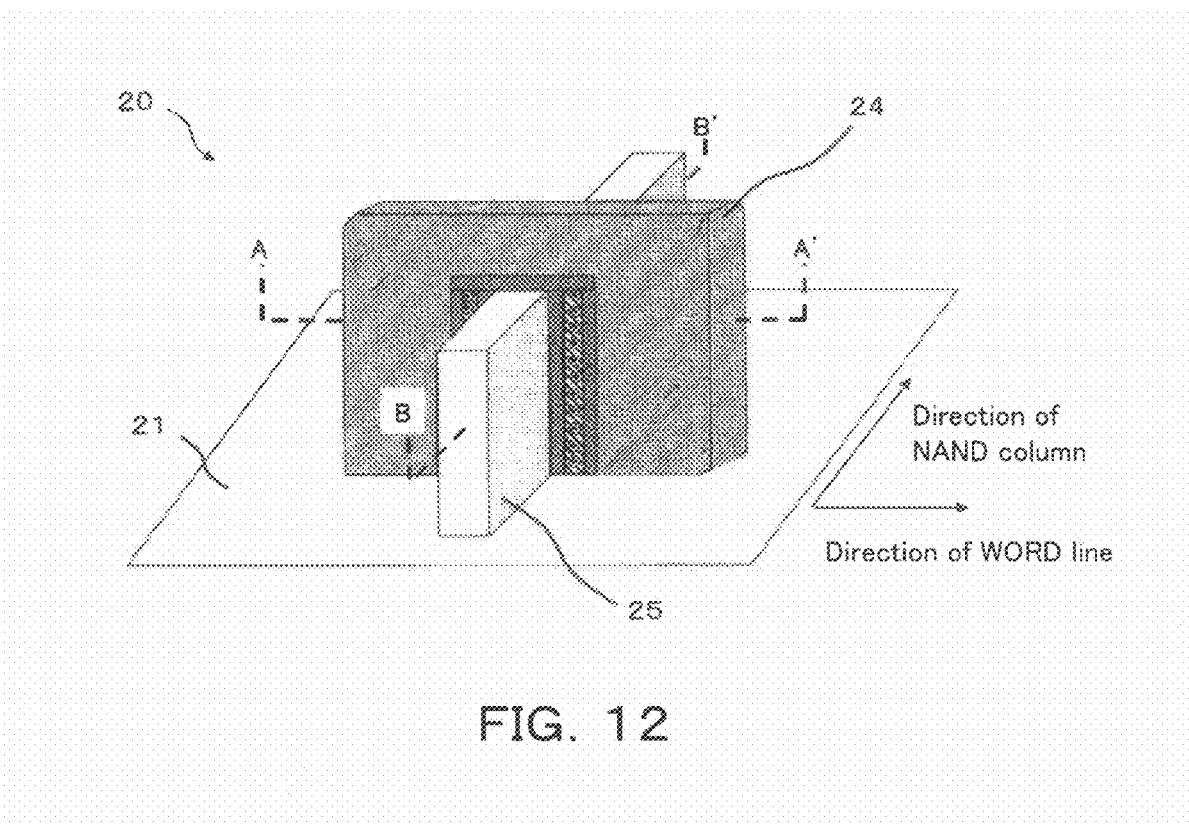
FIG. 12 is a view showing a fin type semiconductor memory device 20.

The semiconductor memory device 10 according to the embodiment can be used as a fin type such as a semiconductor memory device 20 shown in FIG. 12.

Figure 13:
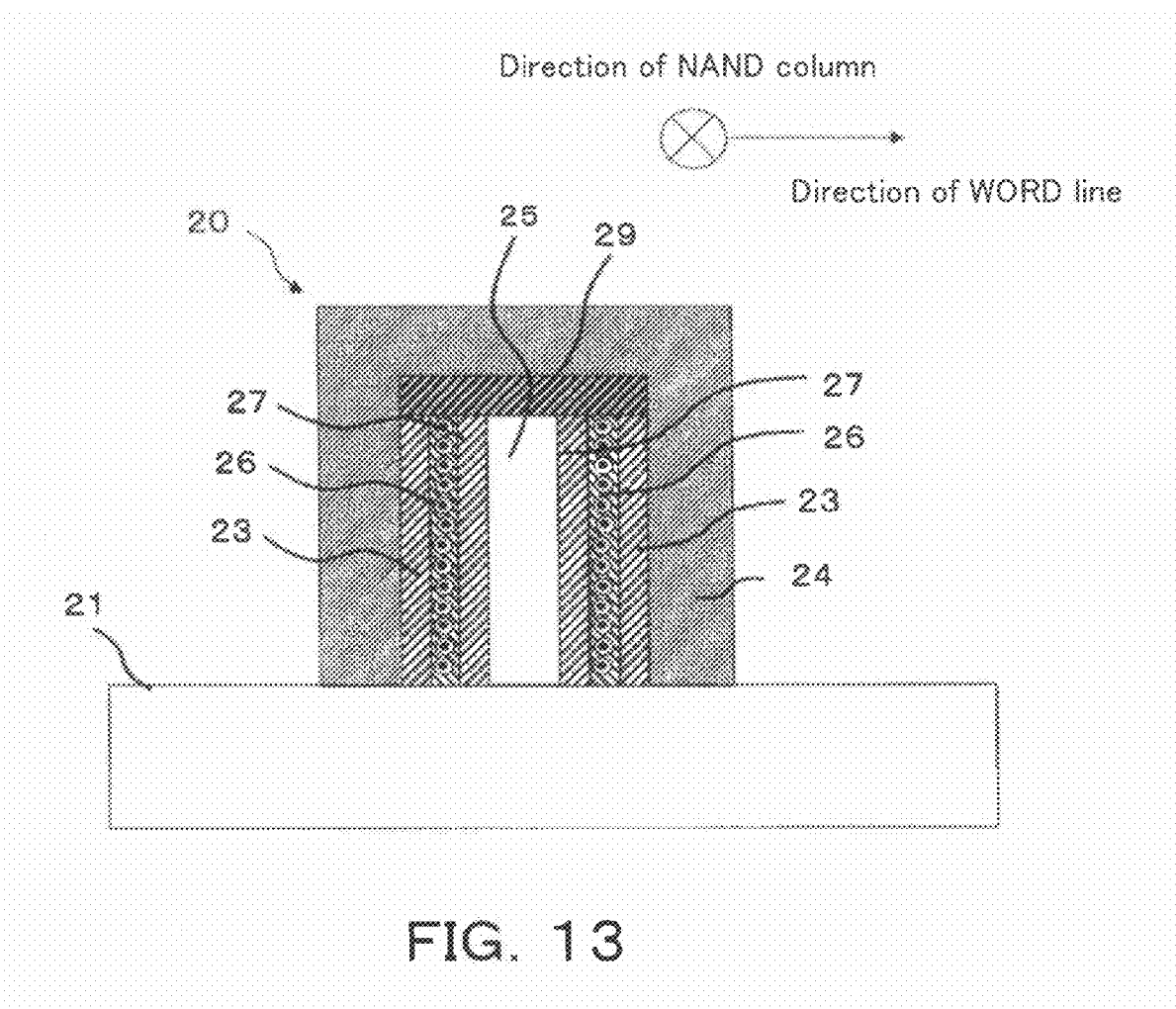
FIG. 13 is a view showing a sectional view at a line A-A' of the semiconductor memory device 20.
Figure 14:
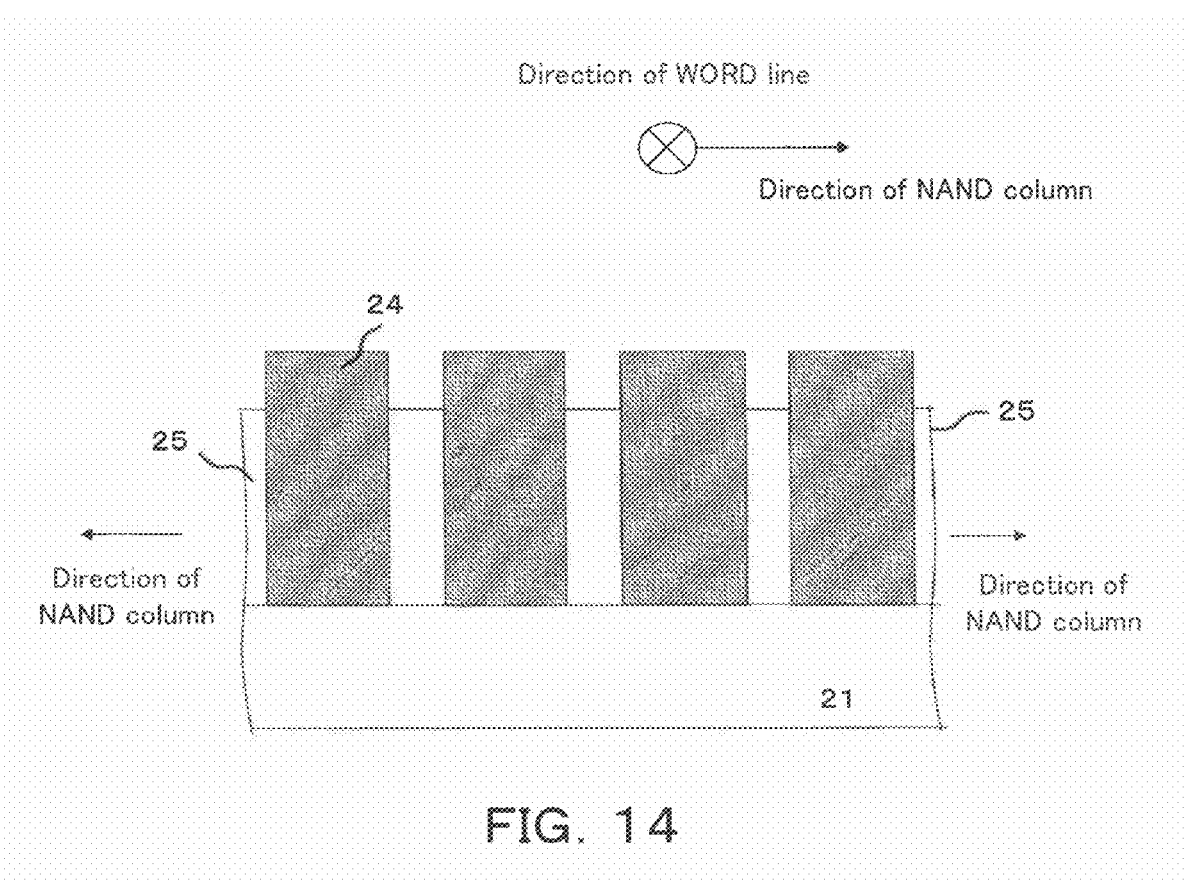
FIG. 14 is a view showing a sectional view at a line B-B' of the semiconductor memory device 20.

FIG. 13 is a view showing a sectional view at a line A-A' of the semiconductor memory device 20 shown in FIG. 12. FIG. 14 is a view showing a sectional view at a line B-B' of the semiconductor memory device 20 shown in FIG. 12. In the semiconductor memory device 20 according to the embodiment, a tunnel insulating film 27, a charge accumulating film 26, a block insulating film 23 and a gate electrode 24 are provided in this order on a semiconductor NAND column (a semiconductor layer) 25 on a semiconductor substrate 21. The B-B' direction is a direction of the NAND column, and gate electrodes 24 are aligned in the direction. A Si channel is provided inside the gate electrode 24, and is ON/OFF switched by the gate electrode 24. The semiconductor memory device 20 accumulates charges from the semiconductor layer 25 in the charge accumulating film 26 via the tunnel insulating film 27 by applying voltage to the gate electrode 24.

Figure 15:
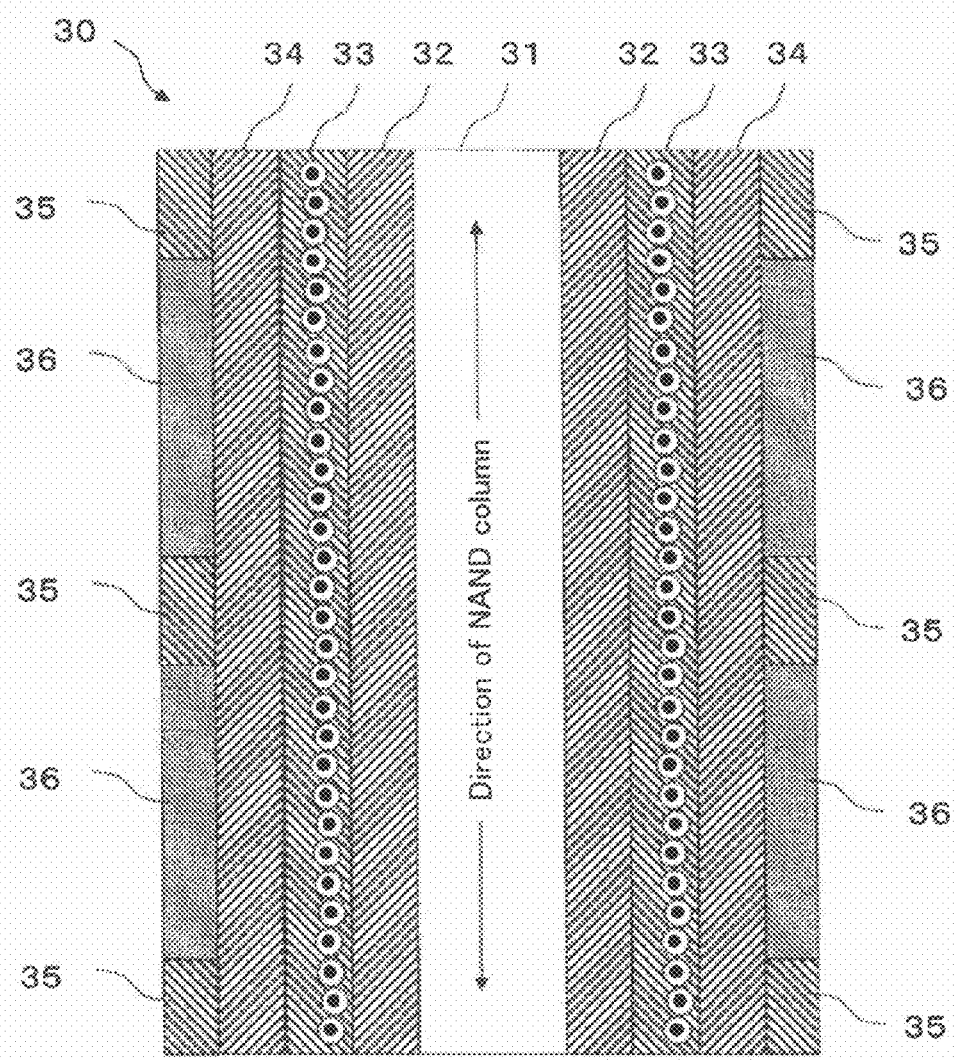
FIG. 15 is a view showing a semiconductor memory device 30.

The semiconductor memory device 10 according to the embodiment may be constructed as a semiconductor memory device 30 shown in FIG. 15 in which a tunnel insulating film 32, a charge accumulating film 33 and a block insulating film 34 sandwich a semiconductor layer 31. In addition, seen from the NAND column direction, the semiconductor layer 31 is concentrically enclosed by the tunnel insulating film 32, the charge accumulating film 33 and the block insulating film 34. In this case, voltage is applied to a gate electrode 36 at a position where to accumulate the charges is wanted. And the semiconductor memory device 30 accumulates the charges from the semiconductor layer 31 to the oxide clusters included in the charge accumulating film 33 via the tunnel insulating film 32. The feature of the structure is that the semiconductor layer 31 stands vertical to the substrate. As in this manner, the memory structure can be manufactured three dimensionally. In the case of manufacturing the semiconductor memory device 30, insulating layers 35 and the gate electrodes 36 are laminated alternately, and a hole is bored in a laminated body of the insulating layers 35 and the gate electrodes 36 from the laminating direction, for example. And at the side wall of the hole bored in the laminated body, the block insulating film 34, the charge accumulating film 33, the tunnel insulating film 32 and the semiconductor layer 31 are formed in this order to manufacture the semiconductor memory device 30.

Figure 16:
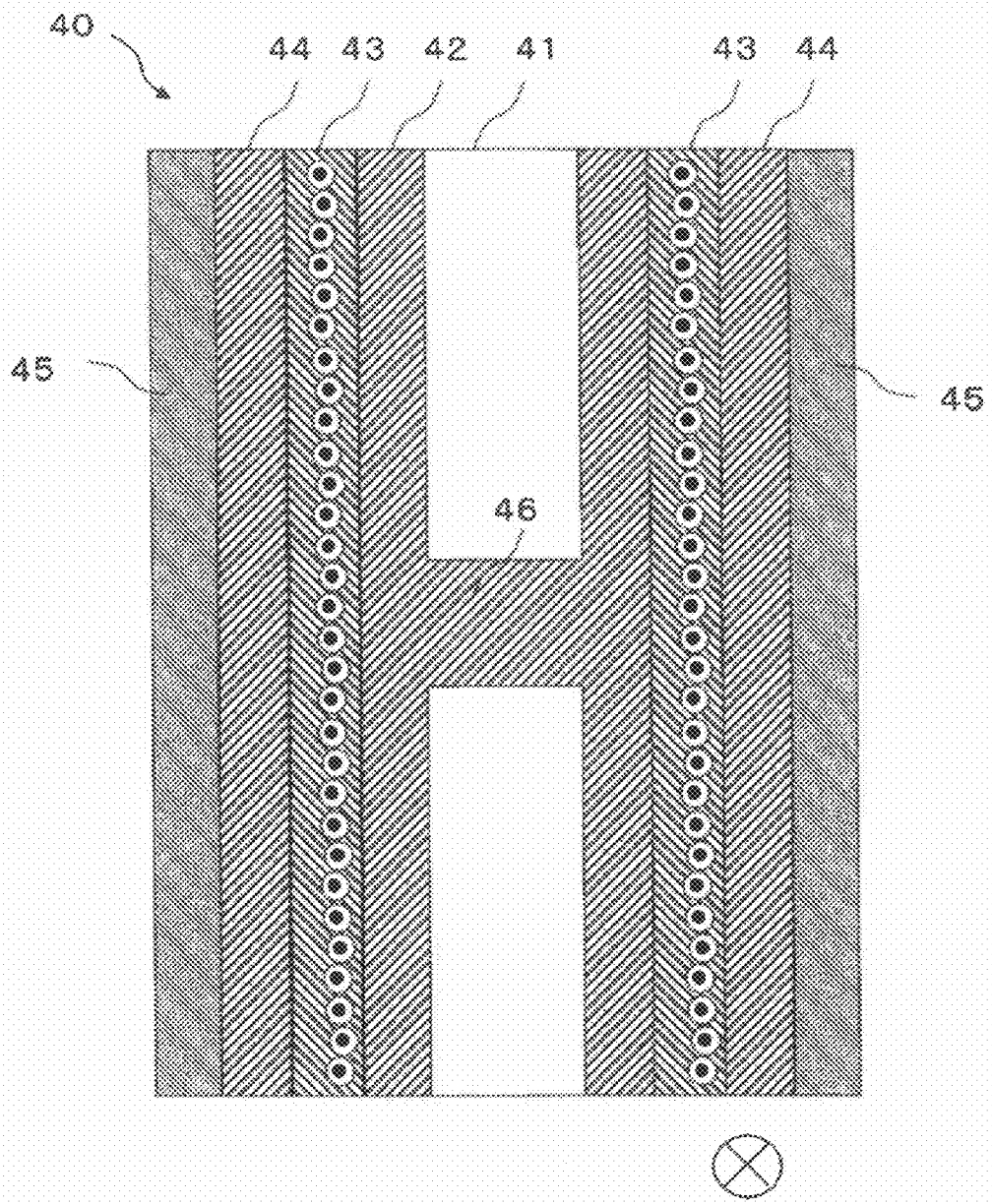
FIG. 16 is a view showing a semiconductor memory device 40.

The semiconductor memory device 10 according to the embodiment may be constructed as a semiconductor memory device 40 shown in FIG. 16 in which two tunnel insulating films 42, two charge accumulating films 43 and two block insulating films 44 sandwich a semiconductor layer 41. In addition, the semiconductor layer 41 is separated by being sandwiched by an insulating film 46. The boundary between the tunnel insulating film 42 and the insulating film 46 becomes unclear because the tunnel insulating film 42 and the insulating film 46 are formed at the same time. In this case, voltage is applied to a gate electrode 45. And the semiconductor memory device 40 accumulates the charges from the semiconductor layers 41 to the oxide clusters included in the charge accumulating films 43 via the tunnel insulating films 42. The feature of the structure is that the semiconductor layers 41 are aligned in parallel with the substrate. By forming films as SiGe/Si/SiGe/Si on the Si substrate, processing into line and space and etching the SiGe portions, Si rods aligned in parallel with the substrate can be formed, for example. The Si rods may be stacked in desired numbers. As in this manner, the memory structure can be manufactured three dimensionally. The direction of the Si rod (a direction vertical to paper surface) is the direction of the NAND column.

Figure 17:
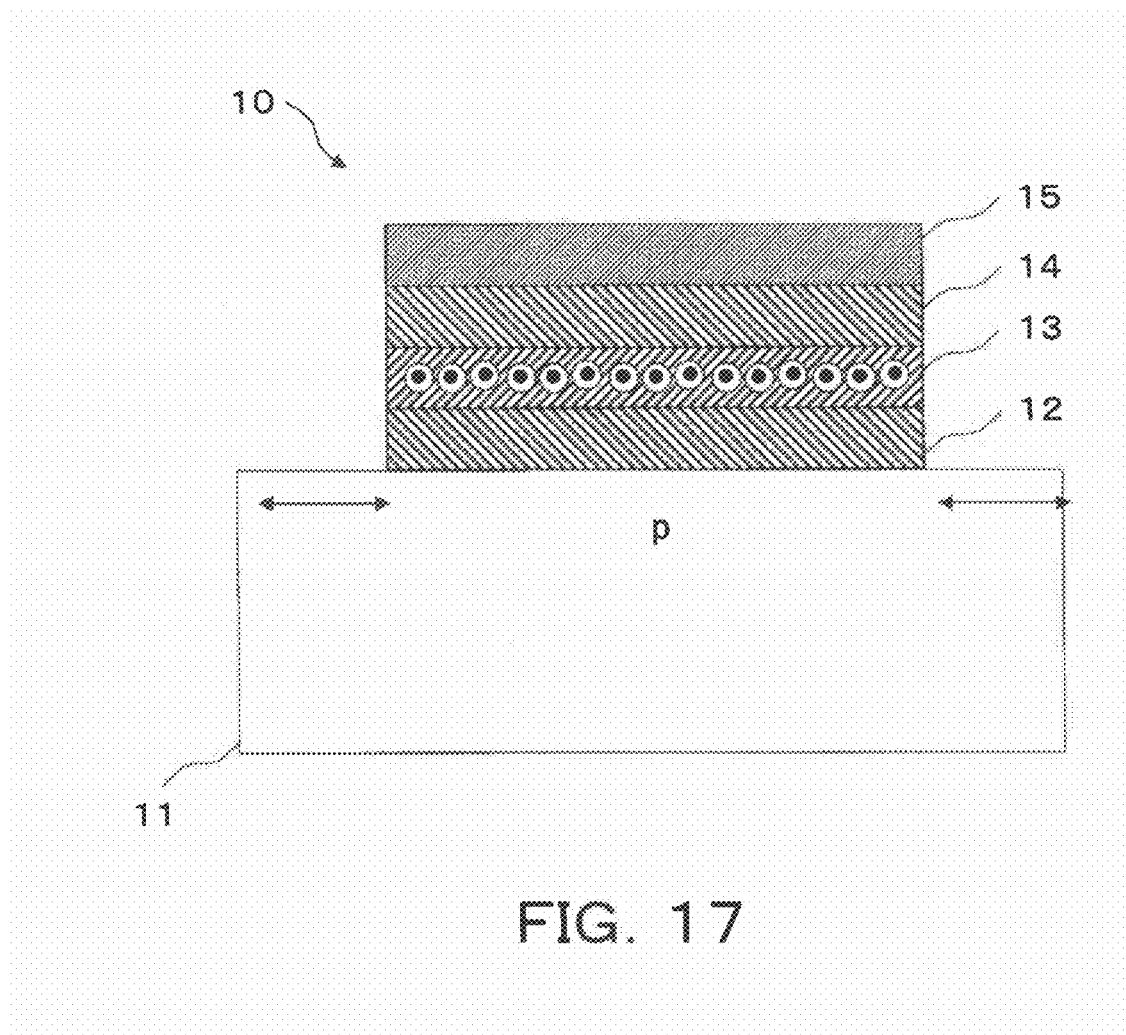
FIG. 17 is a view showing a first modification of the semiconductor memory device 10 according to the first embodiment.

FIG. 17 is a view showing a modification of the semiconductor memory device 10 according to the first embodiment.

The modification differs from the semiconductor memory device 10 according to the first embodiment in a point that the drain region 2 and the source region 3 are not formed.

In this case, the electric field from the gate electrode 15 can form inverted layers in both sides (arrows in FIG. 17) of the semiconductor layer 11 just below the tunnel insulating film 12, in addition to the vicinity of the boundary face of the semiconductor layer 11 and the tunnel insulating film 12. When the miniaturization of the semiconductor memory device 10 make progress, the semiconductor memory device 10 such as the modification becomes effective. The structure can be applied to the above-described semiconductor memory device 20 shown in FIGS. 12 to 14, the semiconductor memory device 30 shown in FIG. 15, and the semiconductor memory device 40 shown in FIG. 16.

Figure 18:
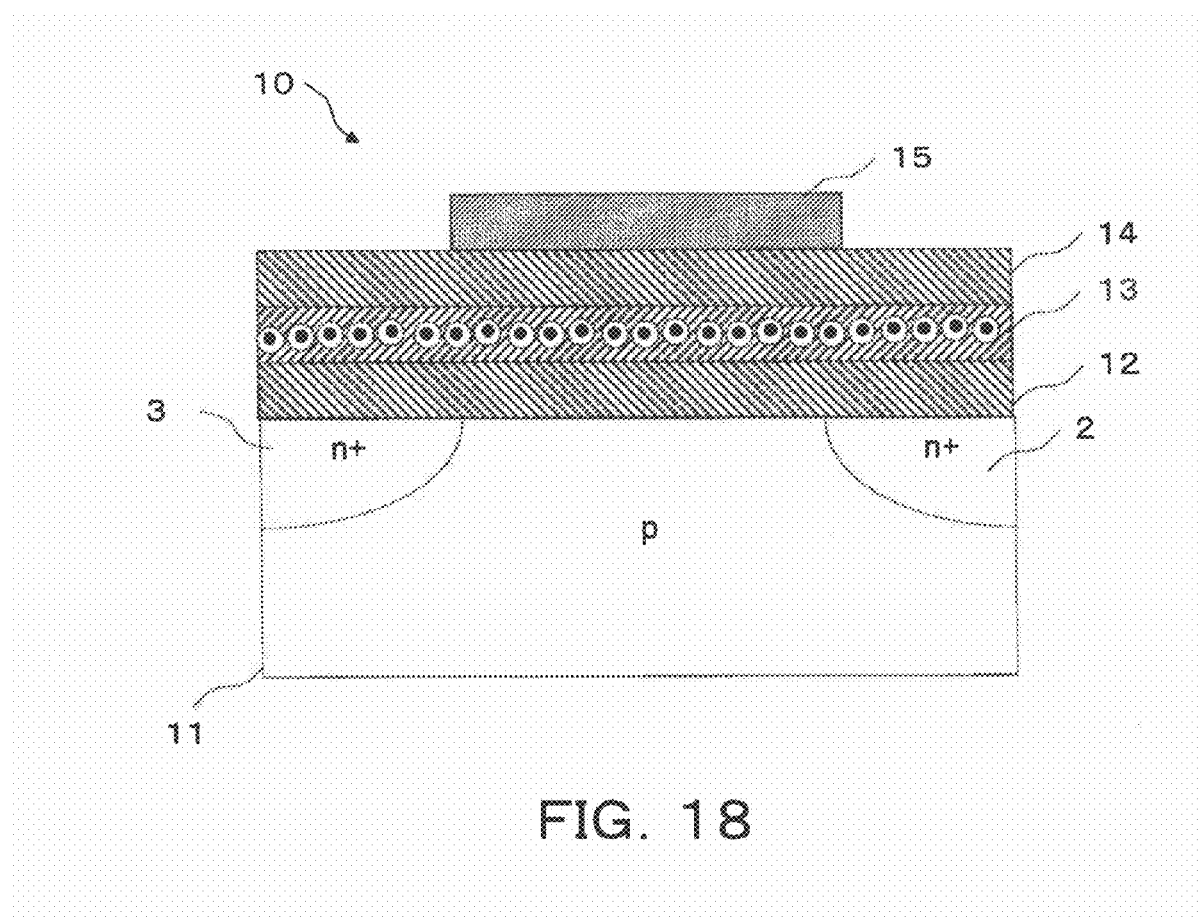
FIG. 18 is a view showing a second modification of the semiconductor memory device 10 according to the first embodiment.

FIG. 18 is a view showing a modification of the semiconductor memory device 10 according to the first embodiment. The modification differs from the semiconductor memory device 10 according to the first embodiment in a point that the tunnel insulating film 12, the charge accumulating film 13 and the block insulating film 14 are not processed. The structure can be applied to the above-described semiconductor memory device 20 shown in FIGS. 12 to 14, the semiconductor memory device 30 shown in FIG. 15, and the semiconductor memory device 40 shown in FIG. 16.

Figure 19:
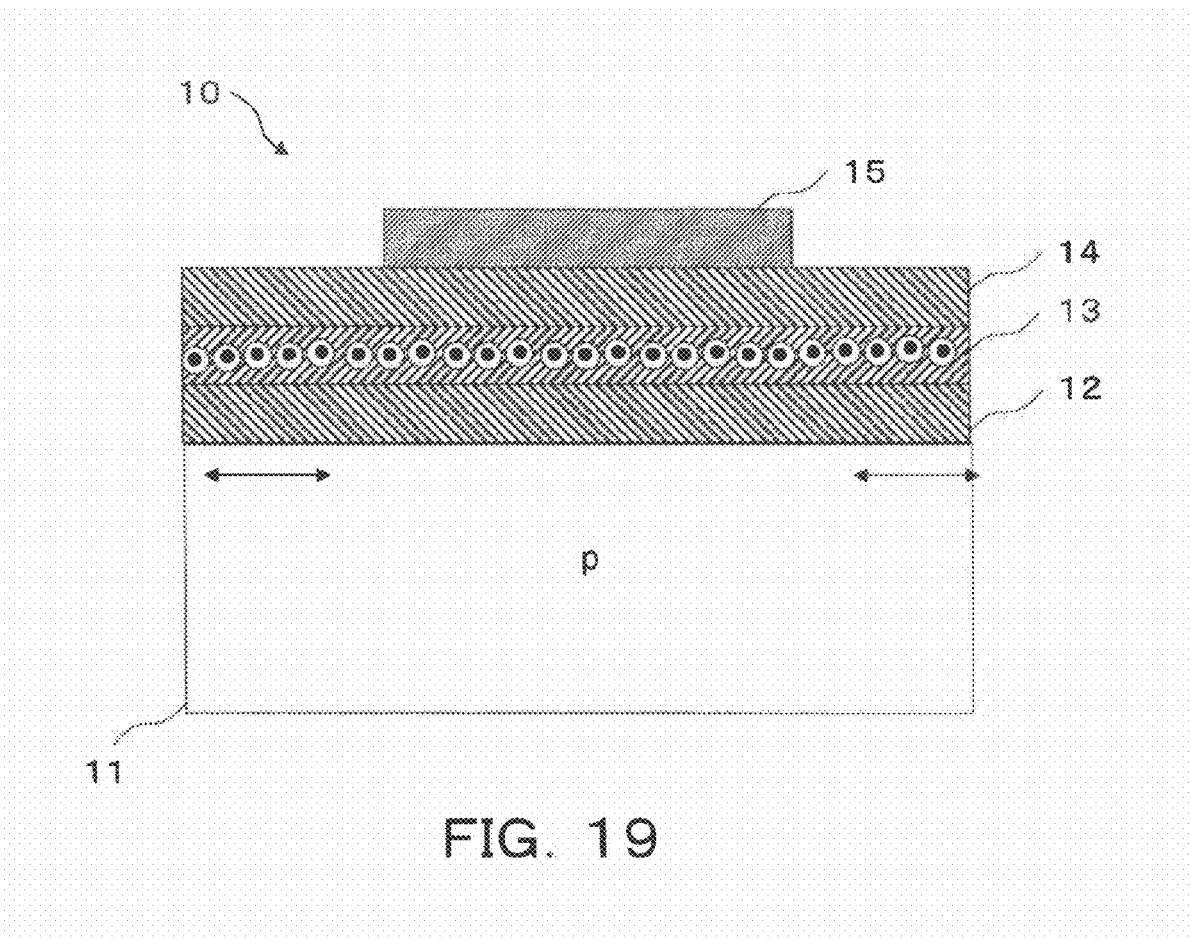
FIG. 19 is a view showing a third modification of the semiconductor memory device 10 according to the first embodiment.

FIG. 19 is a view showing a modification of the semiconductor memory device 10 according to the first embodiment. The modification has a structure formed by combining the first and second modifications. The structure can be applied to the above-described semiconductor memory device 20 shown in FIGS. 12 to 14, the semiconductor memory device 30 shown in FIG. 15, and the semiconductor memory device 40 shown in FIG. 16.

The semiconductor memory devices 10, 20, 30, 40 as described above can obtain the operations and effects described below.

(1) It is possible to accumulate a lot of charges in the charge accumulating film. (2) As electron exists intrinsically in a deep level, over erasing is performed easily. (3) As the structure is simple, to manufacture the structure up to 3D is cheep and easy. (4) As it is unlikely for the oxide clusters to mix with $SiO_2$ or $Al_2O_3$ composing the charge accumulating film, the position control in the film thickness direction is performed easily. And the thickness ratio of the film thicknesses of the tunnel insulating film (0.5 nm-5 nm) and the block insulating film and so on can be optimized. As a result, the positions of the oxide clusters in the charge accumulating film can be controlled. Thus, while speeding up writing and erasing, the shift amount of the threshold voltages can be made large. (5) In addition, as the distribution of the oxide clusters in the laminating direction of the charge accumulating film is small, the half-value width of the threshold voltages can be made small. In addition, the writing and erasing times so as to change the threshold voltages can be shortened. (6) As the oxide clusters themselves exist in the high energy barrier of $SiO_2$ or $Al_2O_3$, the generation of the leakage of the charges can be suppressed. (7) As it is possible to accumulate multiple charges in the d orbital, it is easy to provide the semiconductor memory device with multiple values. (8) As the manufacturing process is simple, a memory can be manufactured easily.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor memory device, comprising;
  a semiconductor layer;
  a tunnel insulating film formed on the semiconductor layer and being at least one compound selected from a silicon oxide, a silicon oxynitride, a silicon nitride, an aluminum oxide, an aluminum oxynitride, and an aluminum nitride;
  a charge accumulating film formed on the tunnel insulating film and including a zirconium oxide cluster or a hafnium oxide cluster;
  a block insulating film formed on the charge accumulating film; and
  a gate electrode formed on the block insulating film,
  wherein the zirconium oxide cluster or the hafnium oxide cluster includes at least one element selected from Ti, V, Cr, Mn, Fe, Co, Ni, Cu, Zn, Nb, Mo, Tc, Ru, Rh, Pd, Ag, Cd, Ta, W, Re, Os, Ir, Pt, Au and Hg.

2. The semiconductor memory device according to claim 1, wherein the zirconium oxide cluster or the hafnium oxide cluster is distributed on a plane in the charge accumulating film.

3. The semiconductor memory device according to claim 1, wherein the surface density of the element in the zirconium oxide cluster or the surface density of the element in the hafnium oxide cluster is equal to or above $8.6 \times 10^{12}$ cm$^{-2}$ and is below $1.25 \times 10^{15}$ cm$^{-2}$.

4. The semiconductor memory device according to claim 2, wherein the size of the zirconium oxide cluster or the size of the hafnium oxide cluster is from 0.4 nm to 2.5 nm in a direction of film thickness of the charge accumulating film.

5. The semiconductor memory device according to claim 1, wherein the zirconium oxide cluster is selected from $ZrO_2$, $SrZrO_3$, (Ba, Sr, Ca)$ZrO_3$ and $La_2Zr_2O_7$, the hafnium oxide cluster is selected from $HfO_2$, $SrHfO_3$, (Ba, Sr, Ca) $HfO_3$ and $La_2Hf_2O_7$.

6. The semiconductor memory device according to claim 1, wherein the charge accumulating film and the block insulating film are at least one compound selected from a silicon oxide, a silicon oxynitride, a silicon nitride, an aluminum oxide, an aluminum oxynitride and an aluminum nitride.

7. The semiconductor memory device according to claim 1, wherein the semiconductor layer is concentrically enclosed by the tunnel insulating film, the charge accumulating film, the block insulating film and the gate electrode.

8. A semiconductor memory device, comprising;
  a semiconductor layer;
  a tunnel insulating film formed on the semiconductor layer and being at least one compound selected from a silicon oxide, a silicon oxynitride, a silicon nitride, an aluminum oxide, an aluminum oxynitride, and an aluminum nitride;
  a charge accumulating film formed on the tunnel insulating film and including a titanium oxide cluster;
  a block insulating film formed on the charge accumulating film; and
a gate electrode formed on the block insulating film,
  wherein the titanium oxide cluster includes at least one element selected from V, Cr, Mn, Fe, Co, Ni, Cu, Zn, Nb, Mo, Tc, Ru, Rh, Pd, Ag, Cd, Ta, W, Re, Os, Ir, Pt, Au and Hg.

9. The semiconductor memory device according to claim 8, wherein the titanium oxide cluster is distributed on a plane in the charge accumulating film.

10. The semiconductor memory device according to claim 8, wherein the surface density of the element in the titanium oxide cluster is equal to or above $8.6 \times 10^{12}$ cm$^{-2}$ and is below $1.25 \times 10^{15}$ cm$^{-2}$.

11. The semiconductor memory device according to claim 9, wherein the size of the titanium oxide cluster is from 0.4 nm to 2.5 nm in a direction of film thickness of the charge accumulating film.

12. The semiconductor memory device according to claim 8, wherein the titanium oxide cluster is selected from $TiO_2$, $SrTiO_3$, (Ba, Sr, Ca) $TiO_3$ and $La_2Ti_2O_7$.

13. The semiconductor memory device according to claim 8, wherein the charge accumulating film and the block insulating film are at least one compound selected from a silicon oxide, a silicon oxynitride, a silicon nitride, an aluminum oxide, an aluminum oxynitride and an aluminum nitride.

14. The semiconductor memory device according to claim 8, wherein the semiconductor layer is concentrically enclosed by the tunnel insulating film, the charge accumulating film, the block insulating film and the gate electrode.

\* \* \* \* \*